(12) United States Patent
Check et al.

(10) Patent No.: US 12,557,444 B2
(45) Date of Patent: Feb. 17, 2026

(54) LIGHT-EMITTING DIODE CHIP STRUCTURES WITH ELECTRICALLY INSULATING SUBSTRATES AND RELATED METHODS

(71) Applicant: CreeLED, Inc., Durham, NC (US)

(72) Inventors: Michael Check, Holly Springs, NC (US); Michael John Bergmann, Atlanta, GA (US); David Suich, Durham, NC (US); Kevin Haberern, Cary, NC (US)

(73) Assignee: CreeLED, Inc., Durham, NC (US)

( * ) Notice: Subject to any disclaimer, the term of this patent is extended or adjusted under 35 U.S.C. 154(b) by 375 days.

(21) Appl. No.: 18/308,323

(22) Filed: Apr. 27, 2023

(65) Prior Publication Data

US 2023/0361249 A1  Nov. 9, 2023

Related U.S. Application Data

(60) Provisional application No. 63/364,234, filed on May 5, 2022.

(51) Int. Cl.
*H10H 20/831* (2025.01)
*H10H 20/819* (2025.01)

(52) U.S. Cl.
CPC ...... *H10H 20/8314* (2025.01); *H10H 20/819* (2025.01)

(58) Field of Classification Search
CPC .................................................. H10H 20/8312
See application file for complete search history.

(56) References Cited

U.S. PATENT DOCUMENTS 5,252,842 A * 10/1993 Buck .................... H10D 30/875
257/E29.32
5,905,275 A * 5/1999 Nunoue ............... H10H 20/825
372/45.01

(Continued)

FOREIGN PATENT DOCUMENTS

EP        2405491 A2    1/2012
WO     2006123580 A1   11/2006

OTHER PUBLICATIONS

International Search Report and Written Opinion for International Patent Application No. PCT/US2023/020806, mailed Sep. 8, 2023, 14 pages.

(Continued)

*Primary Examiner* — Evren Seven
(74) *Attorney, Agent, or Firm* — Withrow & Terranova, P.L.L.C.

(57) ABSTRACT

Light-emitting diode (LED) chips and, more particularly, structures of LED chips with electrically insulating substrates and related methods are disclosed. LED chips include at least one opening that extends through a substrate to provide an electrical pathway to an active LED structure. Another electrical connection may be provided on the active LED structure in a position that forms a vertical contact arrangement. The at least one opening may extend through the substrate and into a portion of the active LED structure to provide increased surface area for the electrical connection. Additional LED chip structures include another opening on the active LED structure that is registered with the opening in the substrate, and electrical connections to a same layer of the active LED structure may be provided within each opening. Related methods include laser drilling the at least one opening in the substrate.

24 Claims, 22 Drawing Sheets

(56) References Cited

U.S. PATENT DOCUMENTS

| | | | | |
|---|---|---|---|---|
| 6,069,394 | A * | 5/2000 | Hashimoto | C30B 25/18 257/466 |
| 6,201,265 | B1 | 3/2001 | Teraguchi | |
| 6,542,530 | B1 | 4/2003 | Shieh et al. | |
| 6,611,002 | B2 * | 8/2003 | Weeks | H10D 30/801 257/190 |
| 6,657,237 | B2 * | 12/2003 | Kwak | H10H 20/811 257/89 |
| 6,794,685 | B2 * | 9/2004 | Hata | H10H 20/018 257/89 |
| 7,202,181 | B2 | 4/2007 | Negley | |
| 7,233,028 | B2 * | 6/2007 | Weeks | H10F 71/1274 257/E29.022 |
| 7,262,440 | B2 * | 8/2007 | Choi | H10H 20/8581 257/E23.012 |
| 7,531,380 | B2 | 5/2009 | Negley | |
| 7,714,345 | B2 | 5/2010 | Negley | |
| 7,745,848 | B1 * | 6/2010 | Rajagopal | H01L 23/3677 438/285 |
| 8,253,152 | B2 * | 8/2012 | Lee | H10H 20/831 257/E33.068 |
| 9,136,436 | B2 * | 9/2015 | Lin | H10H 20/835 |
| 9,142,718 | B2 * | 9/2015 | Hwang | H10H 20/819 |
| 9,281,446 | B2 * | 3/2016 | Suh | H10H 20/825 |
| 2001/0040245 | A1 * | 11/2001 | Kawai | B82Y 20/00 257/E21.441 |
| 2002/0005523 | A1 | 1/2002 | Taniguchi et al. | |
| 2002/0074556 | A1 * | 6/2002 | Kwak | H01S 5/22 257/79 |
| 2002/0117681 | A1 * | 8/2002 | Weeks | H10D 8/00 257/E29.022 |
| 2003/0116791 | A1 * | 6/2003 | Baptist | H10H 20/819 257/214 |
| 2004/0217362 | A1 * | 11/2004 | Slater, Jr. | H10H 20/819 257/E33.068 |
| 2006/0278885 | A1 | 12/2006 | Tain et al. | |
| 2010/0244083 | A1 * | 9/2010 | Kim | H10H 20/8511 257/E33.066 |
| 2011/0204403 | A1 * | 8/2011 | Kim | H10H 20/8312 257/E33.072 |
| 2017/0098735 | A1 * | 4/2017 | Huang | H10H 20/013 |

OTHER PUBLICATIONS

Ku, et al., "Improvement of light extraction for AlGaN-based near UV LEDs with flip-chip bonding fabricated on grooved sapphire substrate using laser ablation," Materials Science in Semiconductor Processing, vol. 95, 2019, Elsevier Ltd., pp. 48-53.

Kuna, et al., "Improvement of light extraction from high-power flip-chip light-emitting diodes by femtosecond laser direct structuring of the sapphire backside surface," Journal of Applied Physics, vol. 104, Oct. 2008, 8 pages.

Kuna, et al., "Surface Texturing of High-Power Flip-Chip LEDs by Femtosecond Laser Direct Structuring," IEEE Journal of Selected Topics in Quantum Electronics, vol. 15, Issue 4, Aug. 2009, pp. 1250-1256.

Lee, et al., "InGaN-Based High-Power Flip-Chip LEDs With Deep-Hole-Patterned Sapphire Substrate by Laser Direct Beam Drilling," IEEE Electron Device Letters, vol. 31, Issue 7, Jul. 2010, pp. 698-700.

Shen, et al., "Nitride-Based High-Power Flip-Chip LED With Double-Side Patterned Sapphire Substrate," IEEE Photonics Technology Letters, vol. 19, Issue 10, May 15, 2007, pp. 780-782.

Vilar, et al., "Surface morphology and phase transformations of femtosecond laser-processed sapphire," Applied Surface Science, vol. 288, 2014, Elsevier, B.V., pp. 313-323.

Zhang, et al., "Improved light output from InGaN LEDs by laser-induced dumbbell-like air-voids," Optics Express, vol. 21, Issue 26, Dec. 2013, OSA, 7 pages.

\* cited by examiner

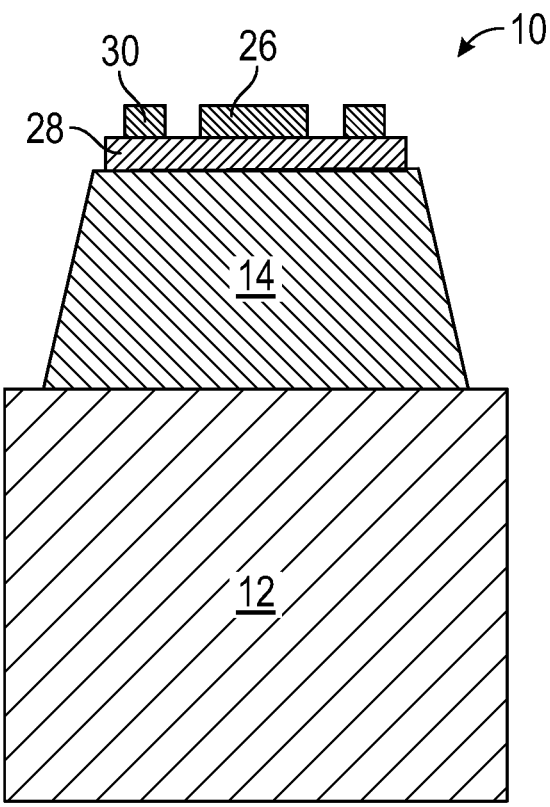
FIG. 4A
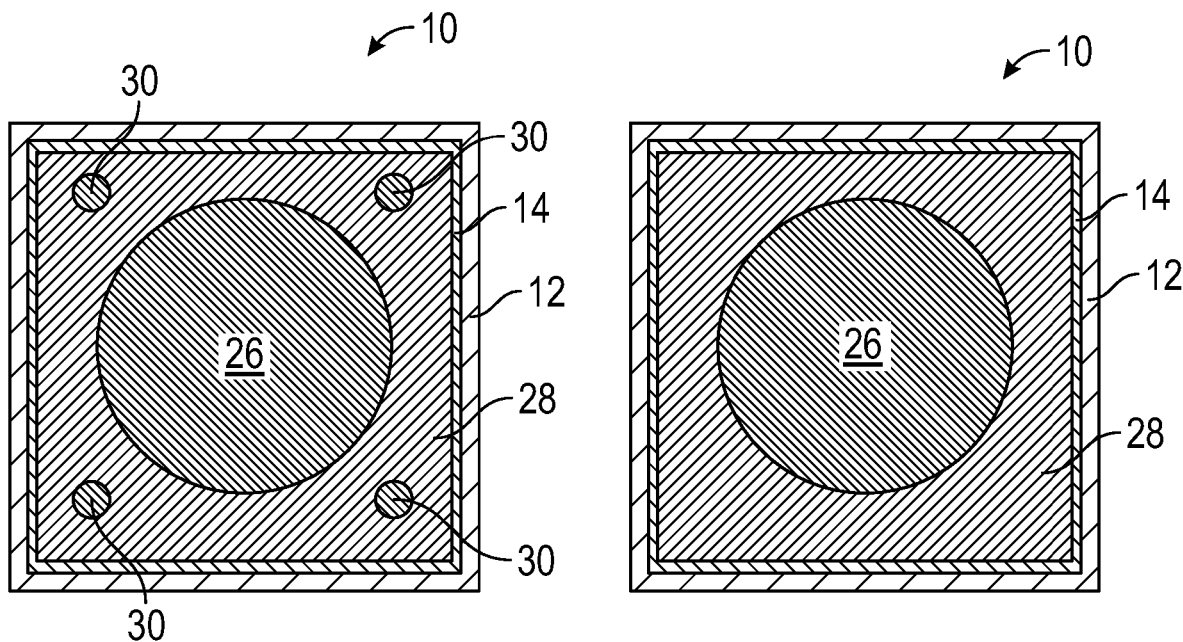
FIG. 4B  FIG. 4C

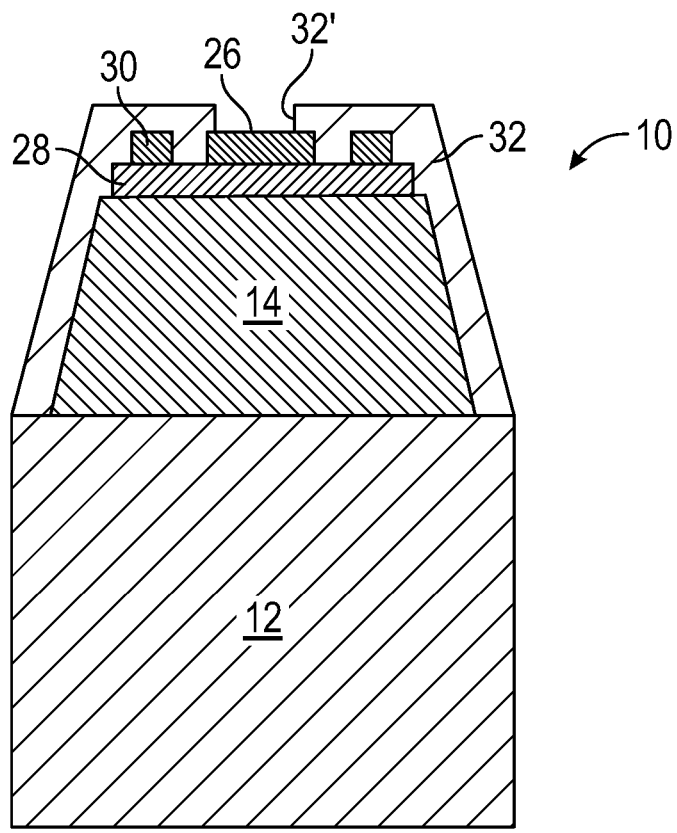
FIG. 5A
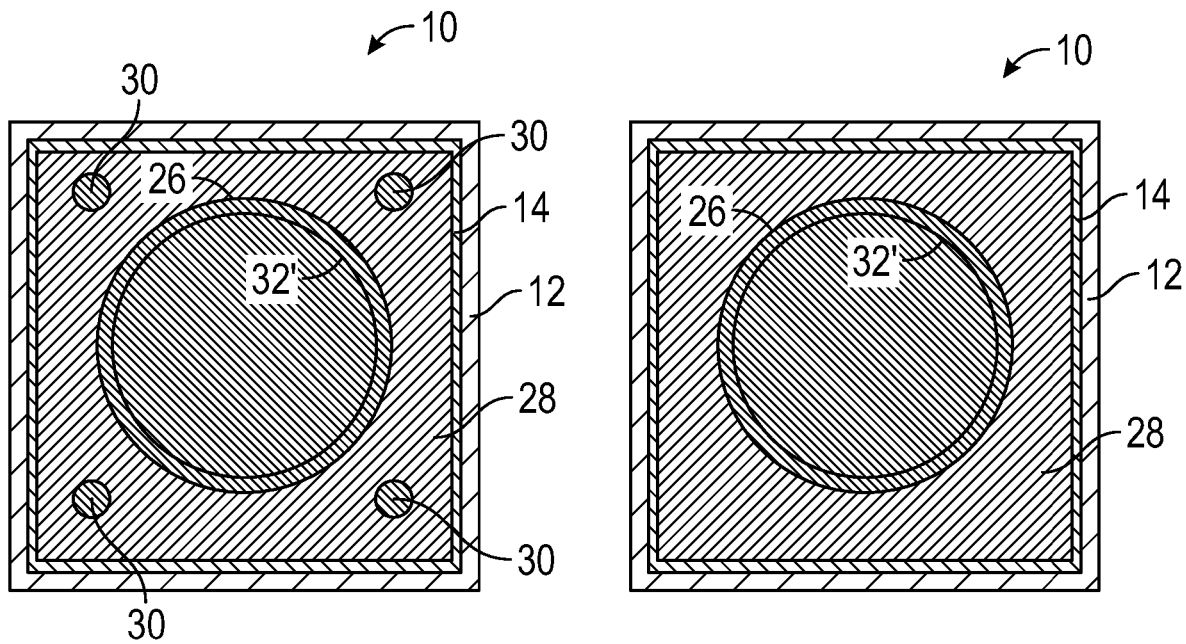
FIG. 5B  FIG. 5C

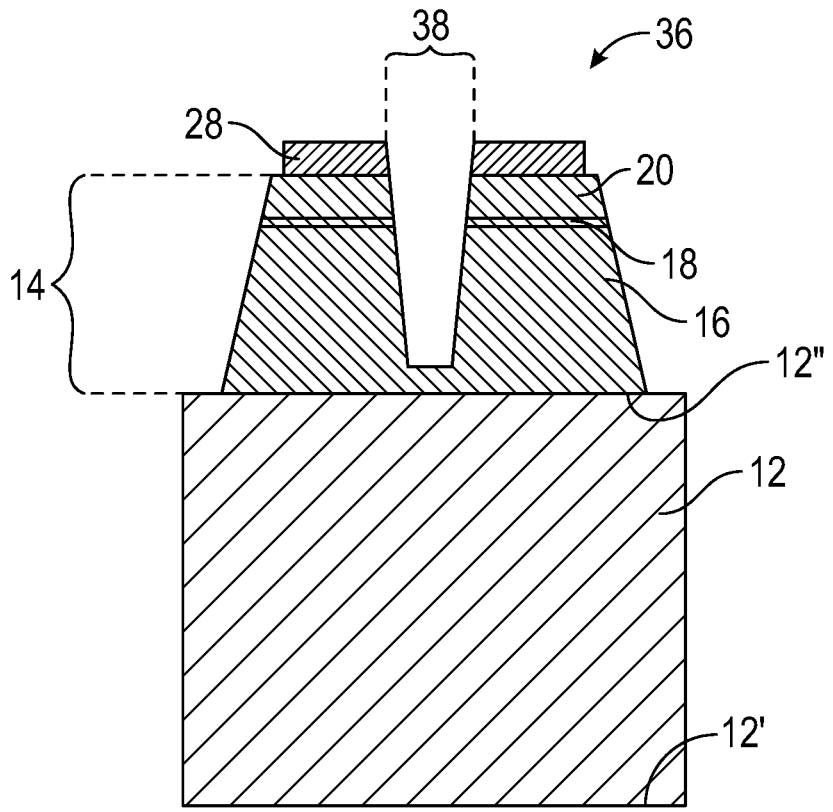
FIG. 10A
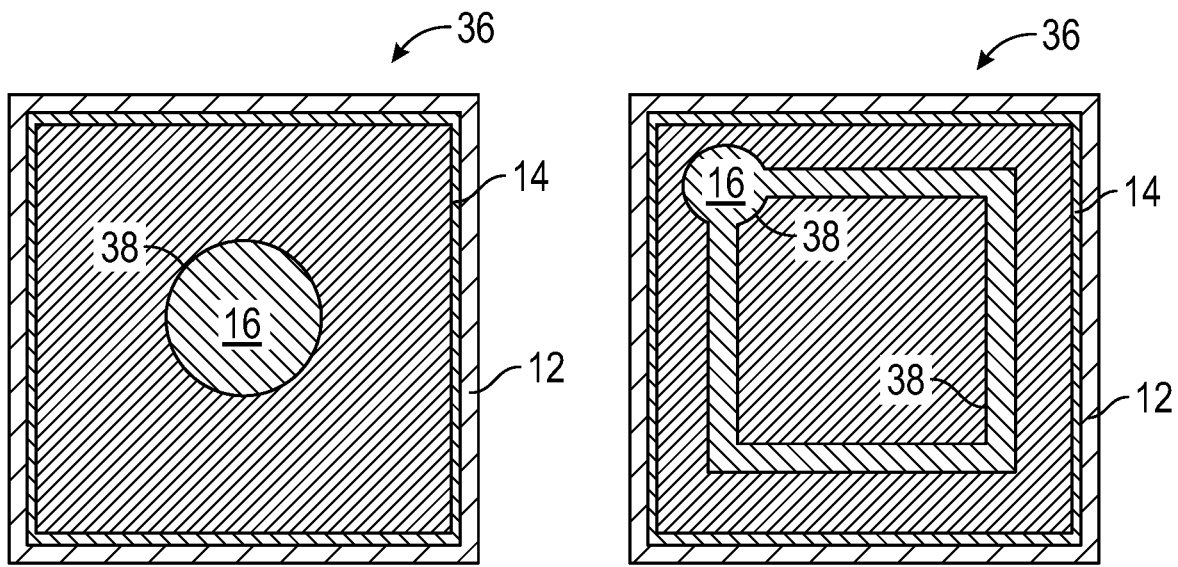
FIG. 10B   FIG. 10C

LIGHT-EMITTING DIODE CHIP STRUCTURES WITH ELECTRICALLY INSULATING SUBSTRATES AND RELATED METHODS

RELATED APPLICATIONS

This application claims the benefit of provisional patent application Ser. No. 63/364,234, filed May 5, 2022, the disclosure of which is hereby incorporated herein by reference in its entirety.

FIELD OF THE DISCLOSURE

The present disclosure relates to light-emitting diode (LED) chips and, more particularly, to structures of LED chips with insulating substrates and related methods.

BACKGROUND

Solid-state lighting devices such as light-emitting diodes (LEDs) are increasingly used in both consumer and commercial applications. Advancements in LED technology have resulted in highly efficient and mechanically robust light sources with long service life. Accordingly, modern LEDs have enabled a variety of new display applications and general illumination applications.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An active region may be fabricated, for example, from silicon carbide, gallium nitride, gallium phosphide, aluminum nitride, and/or gallium arsenide-based materials and/or from organic semiconductor materials. Photons generated by the active region are initiated in all directions.

Typically, it is desirable to operate LEDs at the highest light emission efficiency, which can be measured by the emission intensity in relation to the output power (e.g., in lumens per watt). A practical goal to enhance emission efficiency is to maximize extraction of light emitted by the active region in the direction of the desired transmission of light. Light extraction and external quantum efficiency of an LED can be limited by a number of factors, including internal reflection and current injection. To reduce internal reflection, it has been found useful to pattern, roughen, or otherwise texture the interface between an LED surface and the surrounding environment to provide a varying surface that increases the probability of refraction over internal reflection. Reflective surfaces may also be provided to reflect generated light so that such light may contribute to useful emission from an LED chip. To increase current spreading and current spreading within an LED chip, and in particular for larger area LED chips, it has been found useful to add layers of high electrical conductivity over one or more epitaxial layers of an LED. Additionally, electrodes for the LEDs can have larger surface areas and may include various electrode arrangements that are configured to route and more evenly distribute current across an LED.

As advancements in modern LED technology progress, the art continues to seek improved LEDs and solid-state lighting devices having desirable illumination characteristics capable of overcoming challenges associated with conventional lighting devices.

SUMMARY

The present disclosure relates to light-emitting diode (LED) chips and, more particularly, to structures of LED chips with electrically insulating substrates and related methods. LED chip structures include an active LED structure on a substrate and at least one opening that extends through the substrate to provide a pathway for an electrical connection to the active LED structure. Another electrical connection may be provided on the active LED structure in a position that is opposite the substrate to form a vertical contact arrangement. The at least one opening may extend through the substrate and into a portion of the active LED structure to provide increased surface area for the electrical connection. Additional LED chip structures include another opening on the active LED structure that is registered with the opening in the substrate. Electrical connections to a same layer of the active LED structure may be provided within each opening. The openings and corresponding electrical connections may be arranged with various shapes that promote improved current spreading and, in some instances, tailored emission patterns and/or brightness levels for corresponding LED chips. Related methods include laser drilling the at least one opening in the substrate.

In one aspect, an LED chip comprises: a substrate that is electrically insulating, the substrate forming an opening that extends through an entire thickness of the substrate; an active LED structure on the substrate, the active LED structure comprising a n-type layer, an active layer, and a p-type layer; a first contact on a portion of the substrate that is outside the opening and on a sidewall of the opening, the first contact being in electrical contact with the n-type layer; and a second contact on and in electrical contact with the p-type layer such that the active LED structure and at least a portion of the substrate are arranged between the first contact and the second contact. In certain embodiments, a portion of the first contact extends from the sidewall and into the n-type layer. In certain embodiments, a width of the portion of the first contact within the n-type layer is wider than a width of the opening at an interface between the substrate and the active LED structure. In certain embodiments the substrate comprises a first surface and a second surface that is opposite the first surface, and the second surface forms an interface with the active LED structure; and the opening comprises a first width at the first surface and a second width at the second surface, wherein the first width is larger than the second width. In certain embodiments, the opening comprises a sloped sidewall between the first surface and the second surface. In certain embodiments, the sloped sidewall forms an angle as measured from a perpendicular line to the second surface, wherein the angle is in a range from 1 degree to 60 degrees, or in a range from 1 degree to 30 degrees. In certain embodiments, the first width is in a range from 40 microns 30 (μm) to 100 μm.

The LED chip may further comprise an emission altering feature on the p-type layer and laterally spaced from the second contact, wherein the emission altering features is configured to absorb or reflect a portion of light generated by the active LED structure. In certain embodiments, the emission altering feature comprises a same material as the second contact. In certain embodiments, the emission altering feature comprises a same thickness as the second contact.

In certain embodiments, the substrate comprises sapphire. In certain embodiments, the substrate comprises an electrically insulating layer on a conductive support element.

In another aspect, an LED chip comprises: a substrate that is electrically insulating, the substrate comprising a first surface, a second surface, and a first opening that extends from the first surface to the second surface; an active LED structure on the second surface of the substrate, the active LED structure comprising a n-type layer, an active layer, a p-type layer, and a second opening that extends through the p-type layer, the active layer, and a portion of the n-type layer, wherein the first opening is vertically registered with the second opening; a first contact within the first opening; a second contact on and in electrical contact with the p-type layer; and a third contact within the second opening, wherein the first contact and the third contact are electrically coupled with the n-type layer. In certain embodiments, the first contact is arranged to extend through a portion of the n-type layer to contact the third contact. In certain embodiments, the first contact is further arranged to extend into at least a portion of the third contact. In certain embodiments, the third contact is in contact with a greater surface area of the n-type layer than the first contact. In certain embodiments, the second opening forms an extension that laterally traverses across the n-type layer. In certain embodiments, the third contact comprises a contact extension that is arranged within the extension of the second opening. The LED chip may further comprise one or more passivation layers that cover the third contact within the second opening. In certain embodiments, the first opening comprises a first width at the first surface and a second width at the second surface, wherein the first width is larger than the second width. In certain embodiments, the first opening comprises a sloped sidewall between the first surface and the second surface. In certain embodiments, the sloped sidewall forms an angle as measured from a perpendicular line to the second surface, wherein the angle is in a range from 1 degree to 60 degrees.

In certain embodiments, the substrate comprises sapphire. In certain embodiments, the substrate comprises an electrically insulating layer on a conductive support element.

In certain embodiments, the first contact is arranged to extend entirely through the n-type layer and the third contact and into a portion of the second opening.

In another aspect, a method for fabricating an LED chip comprises: forming an active LED structure on a substrate, the active LED structure comprising a n-type layer, an active layer, and a p-type layer, and the substrate comprising an electrically insulating substrate with a first surface and an opposing second surface, the active LED structure being formed on the second surface of the substrate; and forming an opening in the substrate that extends from the first surface to the second surface and partially within the n-type layer. In certain embodiments, the opening comprises a first width at the first surface and a second width at the second surface, and the first width is larger than the second width. In certain embodiments, the active LED structure comprises epitaxially growing the active LED structure on the second surface of the substrate. In certain embodiments, forming the opening in the substrate comprises laser drilling from the first surface of the substrate. The method may further comprise etching a portion of the n-type layer through the opening. The method may further comprise forming a first contact on the first surface of the substrate within the opening and partially within the n-type layer. In certain embodiments, a lateral width of the portion of the first contact within the n-type layer is wider than a width of the opening at the second surface of the substrate. The method may further comprise forming an opening in the active LED structure that extends through the p-type layer, the active layer, and a portion of the n-type layer before forming the opening in the substrate. In certain embodiments, the opening in the active LED structure is vertically registered with the opening in the substrate.

The method may further comprise: forming a first contact on the first surface of the substrate, wherein the first contact extends within the opening in the substrate and partially within the n-type layer; forming a second contact on and electrically coupled with the p-type layer; and forming a third contact within the opening in the active LED structure, wherein the first contact and the third contact are electrically coupled with the n-type layer. In certain embodiments, the first contact is arranged to extend into at least a portion of the third contact. In certain embodiments, the first contact is arranged to extend entirely through the third contact and into a portion of the opening in the active LED structure. The method may further comprise forming one or more passivation layers that cover the third contact within the opening in the active LED structure. In certain embodiments, the opening in the active LED structure forms an extension that laterally traverses across the n-type layer, and the third contact comprises a contact extension that is arranged within the extension of the opening in the active LED structure.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 4A is a generalized cross-section of the LED chip of FIG. 3A at a subsequent fabrication step after the second contact and any emission altering features have been formed.

FIG. 4B is a corresponding top view of the LED chip of FIG. 4A.

FIG. 4C is an alternative corresponding top view of the LED chip of FIG. 4A without the emission altering features.

FIG. 5A is a generalized cross-section of the LED chip of FIG. 4A at a subsequent fabrication step after the passivation layer has been formed.

FIG. 5B is a corresponding top view of the LED chip of FIG. 5A.

FIG. 5C is an alternative corresponding top view of the LED chip of FIG. 5A without the emission altering features.

FIG. 10A is a generalized cross-section of the LED chip of FIG. 9 at fabrication step after the active LED structure and current spreading layer are provided on the substrate and the opening is formed through a portion of the active LED structure.

FIG. 10B is a corresponding top view of the LED chip of FIG. 10A with one arrangement of the opening.

FIG. 10C is a corresponding top view of the LED chip of FIG. 10A with another arrangement of the opening.

DETAILED DESCRIPTION

Figure 1A:
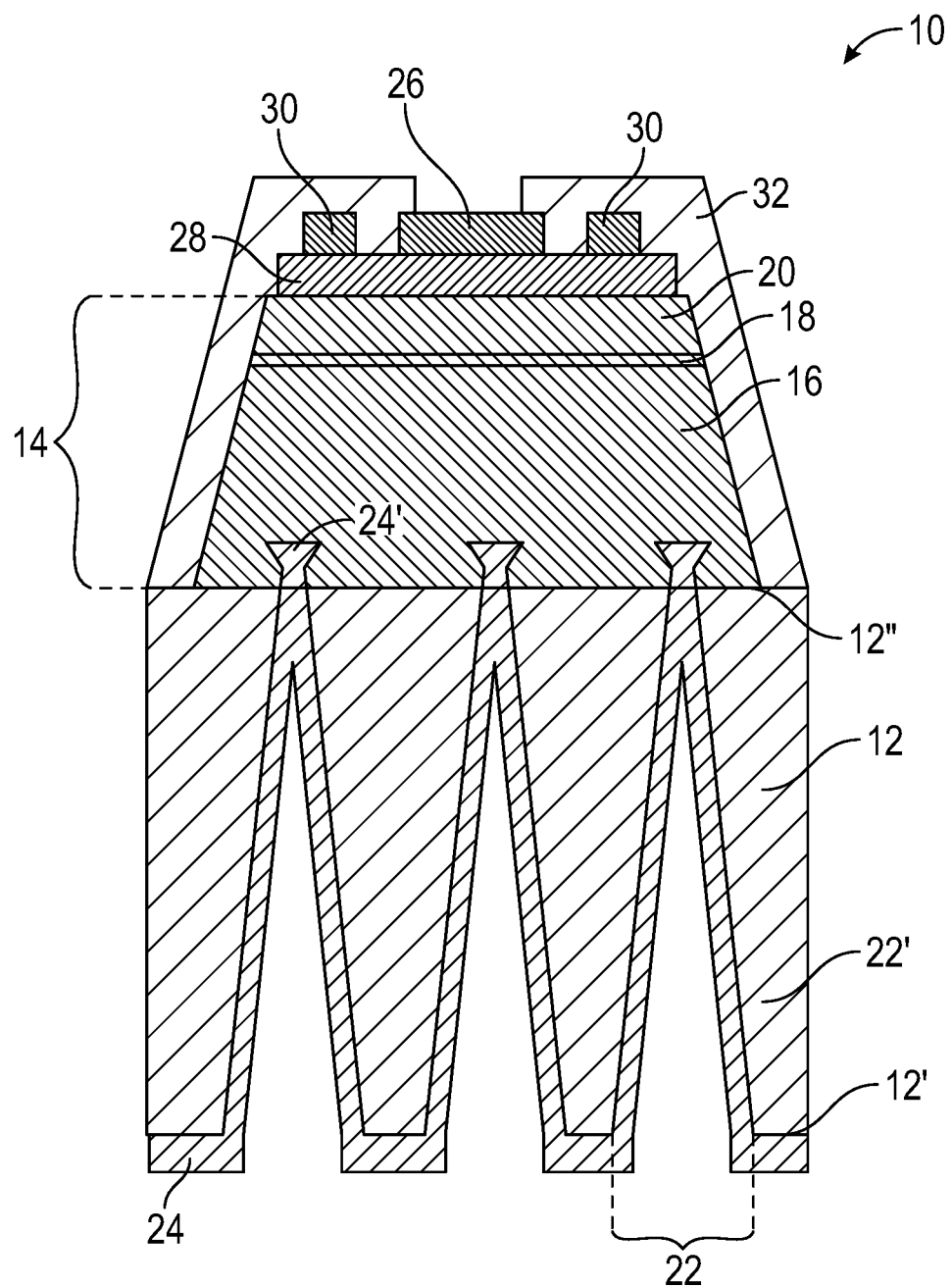
FIG. 1A is a cross-sectional view of a light-emitting diode (LED) chip with a substrate that is electrically insulating and where the LED chip is arranged with a vertical contact structure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to light-emitting diode (LED) chips and, more particularly, to structures of LED chips with electrically insulating substrates and related methods. LED chip structures include an active LED structure on a substrate and at least one opening that extends through the substrate to provide a pathway for an electrical connection to the active LED structure. Another electrical connection may be provided on the active LED structure in a position that is opposite the substrate to form a vertical contact arrangement. The at least one opening may extend through the substrate and into a portion of the active LED structure to provide increased surface area for the electrical connection. Additional LED chip structures include another opening on the active LED structure that is registered with the opening in the substrate. Electrical connections to a same layer of the active LED structure may be provided within each opening. The openings and corresponding electrical connections may be arranged with various shapes that promote improved current spreading and, in some instances, tailored emission patterns and/or brightness levels for corresponding LED chips. Related methods include laser drilling the at least one opening in the substrate.

An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable example being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, un-doped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light transmissive optical properties. However, sapphire is electrically insulating, thereby providing structural limitations in how electrical contacts are provided to the active LED structure.

Different embodiments of the active LED structure can emit different wavelengths of light depending on the composition of the active layer and n-type and p-type layers. In certain embodiments, the active LED structure may emit blue light with a peak wavelength range of approximately 430 nanometers (nm) to 480 nm. In other embodiments, the active LED structure may emit green light with a peak wavelength range of 500 nm to 570 nm. In other embodiments, the active LED structure may emit red light with a peak wavelength range of 600 nm to 650 nm. In certain embodiments, the active LED structure may emit light with a peak wavelength in any area of the visible spectrum, for example peak wavelengths primarily in a range from 400 nm to 700 nm.

In certain embodiments, the active LED structure may be configured to emit light that is outside the visible spectrum, including one or more portions of the ultraviolet (UV) spectrum, the infrared (IR) or near-IR spectrum. The UV spectrum is typically divided into three wavelength range categories denoted with letters A, B, and C. In this manner, UV-A light is typically defined as a peak wavelength range from 315 nm to 400 nm, UV-B is typically defined as a peak wavelength range from 280 nm to 315 nm, and UV-C is typically defined as a peak wavelength range from 100 nm to 280 nm. UV LEDs are of particular interest for use in applications related to the disinfection of microorganisms in air, water, and surfaces, among others. In other applications, UV LEDs may also be provided with one or more lumiphoric materials to provide LED packages with aggregated emissions having a broad spectrum and improved color quality for visible light applications. Near-IR and/or IR wavelengths for LED structures of the present disclosure may have wavelengths above 700 nm, such as in a range from 750 nm to 1100 nm, or more.

The LED chip can also be covered with one or more lumiphoric or other conversion materials, such as phosphors, such that at least some of the light from the LED chip is absorbed by the one or more phosphors and is converted to one or more different wavelength spectra according to the characteristic emission from the one or more phosphors. In some embodiments, the combination of the LED chip and the one or more phosphors emits a generally white combination of light. The one or more phosphors may include yellow (e.g., YAG:Ce), green (e.g., LuAg:Ce), and red (e.g., $Ca_{i-x-y}Sr_xEu_yAlSiN_3$) emitting phosphors, and combinations thereof. Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. In some embodiments, one or more phosphors may include yellow phosphor (e.g., YAG:Ce), green phosphor (e.g., LuAg:Ce), and red phosphor (e.g., $Ca_{i-x-y}Sr_xEu_yAlSiN_3$) and combinations thereof. In certain embodiments, one or more surfaces of LED chips may be conformally coated with one or more lumiphoric materials, while other surfaces of such LED chips and/or associated submounts may be devoid of lumiphoric material. In certain embodiments, a top surface of an LED chip may include lumiphoric material, while one or more side surfaces of an LED chip may be devoid of lumiphoric material. In certain embodiments, all or substantially all outer surfaces of an LED chip (e.g., other than contact-defining or mounting surfaces) are coated or otherwise covered with one or more lumiphoric materials. In certain embodiments, one or more lumiphoric materials may be arranged on or over one or more surfaces of an LED chip in a substantially uniform manner. In other embodiments, one or more lumiphoric materials may be arranged on or over one or more surfaces of an LED chip in a manner that is non-uniform with respect to one or more of material composition, concentration, and thickness.

Light emitted by the active layer or region of an LED chip typically has a lambertian emission pattern. For directional applications, internal mirrors or external reflective surfaces may be employed to redirect as much light as possible toward a desired emission direction. Internal mirrors may include single or multiple layers. Some multi-layer mirrors include a metal reflector layer and a dielectric reflector layer, wherein the dielectric reflector layer is arranged between the metal reflector layer and a plurality of semiconductor layers. A passivation layer is arranged between the metal reflector layer and first and second electrical contacts, wherein the first electrical contact is arranged in conductive electrical communication with a first semiconductor layer, and the second electrical contact is arranged in conductive electrical communication with a second semiconductor layer. For single or multi-layer mirrors including surfaces exhibiting less than 100% reflectivity, some light may be absorbed by the mirror. Additionally, light that is redirected through the active LED structure may be absorbed by other layers or elements within the LED chip.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of UV LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

The present disclosure can be useful for LED chips having a variety of geometries, such as vertical geometry. A vertical geometry LED chip typically includes anode and cathode connections on opposing sides or faces of the LED chip. In certain embodiments, a vertical geometry LED chip may also include a growth substrate that is arranged between the anode and cathode connections. According to principles of the present disclosure, LED chip structures are disclosed that provide vertical geometries for LED chips that include electrically insulating substrates, such as sapphire. In certain embodiments, one or more electrical pathways to the active LED structure of an LED chip are provided through the insulating substrate by way of one or more openings or vias that extend through an entire thickness of the insulating substrate. The openings or vias in the substrate may include electrically conductive materials. The openings may be arranged with various shapes, such as beveled sidewalls of certain angles, that promote improved coverage of electrically conductive materials within the openings. The shapes of the openings may further be configured to tailor emission patterns and/or brightness levels for corresponding LED chips.

FIG. 1A is a cross-sectional view of an LED chip 10 with a substrate 12 that is electrically insulating and where the LED chip 10 is arranged with a vertical contact structure according to principles of the present disclosure. The LED chip 10 includes an active LED structure 14 formed on the substrate 12. In FIG. 1A, a first surface 12' of the substrate 12 is illustrated as a bottom surface of the substrate 12 and an opposing second surface 12", or top surface of the substrate 12, forms an interface with the active LED structure 14. While the active LED structure 14 may have many layers as described above, an n-type layer 16, an active layer 18, and a p-type layer 20 are illustrated in FIG. 1A. It is understood that each of the n-type layer 16, the active layer 18, and the p-type layer 20 may embody a single layer or a multiple layer structure. In certain embodiments, the active LED structure 14 may be epitaxially grown on the substrate 12. As such, the substrate 12 may be referred to as a growth substrate. In certain embodiments, the substrate 12 comprises an electrically insulating material, such as sapphire, AlN, or even electrically insulating SiC. In other embodiments, the substrate 12 may embody a multiple layer structure on which the active LED structure 14 may be formed, such as a layer of electrically insulating material on a conductive support. For example, the substrate 12 may comprise an electrically insulating epitaxial layer on a conductive support such as silicon.

As illustrated in FIG. 1A, one or more openings 22 are formed through an entire thickness of the substrate 12. The openings 22 are provided to facilitate an electrically conductive path through the substrate 12 in order for the LED chip 10 to have a vertical contact structure. A first contact 24 may formed on the first surface 12' of the substrate 12 and within the openings 22. In this regard, the first contact 24 may extend along a sidewall 22' of the opening 22 to ultimately make electrical contact with the n-type layer 16. As such, the first contact 24 may also be referred to as a cathode contact. In certain embodiments, one or more portions 24' of the first contact 24 may extend from the sidewall 22' and into the n-type layer 16 to provide increased surface area for the electrical connection. The portions 24' of the first contact 24 that are within the n-type layer 16 may be formed with a lateral width that is wider than a width of the opening at the second surface 12", thereby providing further increased surface area for electrical connection. In certain embodiments, the first contact 24 may comprise a metal, such as Al or alloys thereof, or chromium or alloys thereof. The selection of material for the first contact 24 may further be based on a desired performance of the LED chip 10. For example, the first contact 24 may be configured to be light-absorbing to wavelengths of light emitted by the active LED structure 14, thereby providing brightness control for the LED chip 10. In another example, the first contact 24 may be configured to be light-reflective and/or light-refractive to wavelengths of light emitted by the active LED structure 14, thereby providing increased light-extraction. In FIG. 1A, the first contact 24 is illustrated covering the sidewalls 22' while not entirely filling the openings 22. Depending on dimensions of the openings 22 and/or deposition conditions, the first contact 24 may entirely fill the openings 22.

A second contact 26 may be provided on and in electrical contact with the p-type layer 20. In this regard, the second contact 26 may also be referred to as an anode contact. In certain structures for the LED chip 10, a current spreading layer 28 may be arranged between the second contact 26 and the p-type layer 20. For example, the current spreading layer 28 may comprise a conductive oxide, such as indium tin oxide (ITO), nickel oxide (NiO), zinc oxide (ZnO), cadmium tin oxide, indium oxide, tin oxide, or magnesium oxide, or another metal layer, such as platinum (Pt). As illustrated, a vertical contact structure is provided where the active LED structure 14 and portions of the substrate 12 are arranged between the first contact 24 and the second contact 26. While the orientation of the n-type layer 16 and the p-type layer 20 relative to active layer 18 are described with the n-type layer 16 being closest to the substrate 12, the principles described are also applicable to LED chip structures where the order is reversed such that the p-type layer 20 is arranged closest to the substrate 12. In such an arrangement, the first contact 24 may be referred to as an anode contact and the second contact 26 may be referred to as a cathode contact.

In certain embodiments, an emission altering feature 30 is also formed on the p-type layer 20, or the spreading layer 28, in a position that is laterally spaced from the second contact 26. The emission altering feature 30 may be provided with a dimension and optical characteristics that alter a brightness level and/or an emission pattern of light that escapes the LED chip 10. For example, the emission altering feature 30 may serve to absorb a portion of light from the active LED structure 14 to provide brightness control. In this regard, a same general chip structure may be tailored to meet different brightness level requirements for a variety of applications. The emission altering feature 30 may serve to reflect or otherwise redirect light in lateral directions, thereby altering an angular emission pattern of the LED chip 10. In certain embodiments, the emission altering feature 30 may comprise the same material and be formed concurrently with the second contact 26, thereby conserving fabrication steps. The emission altering features 30 may comprise a same thickness as the second contact 26 in a direction measured from the current spreading layer 28. In other embodiments, the emission altering feature 30 may be formed separately and with a different material than the second contact 26. A passivation layer 32 may be provided over the LED chip 10. The passivation layer 32 may cover the emission altering feature 30 while leaving a portion of the second contact 26 accessible for providing an electrical connection. The passivation layer 32 may further extend along sidewalls of the active LED structure 14 to a surface of the substrate 12.

Figure 1B:
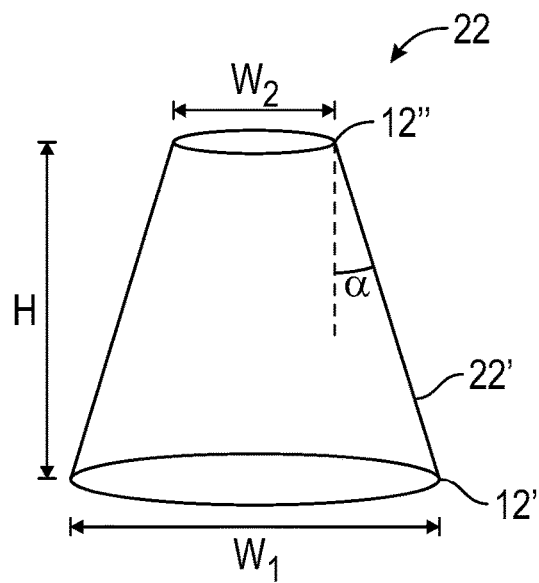
FIG. 1B is an outline of an exemplary shape for one of the openings of FIG. 1A.

In certain embodiments, the openings 22 may be formed by laser drilling into the first surface 12' of the substrate 12 in a direction toward the active LED structure 14. The selection of laser conditions may determine a width of the openings 22 and/or a slope of the sidewalls 22'. In other embodiments, laser drilling may be initially administered to partially form the opening 22 followed by an etching step to complete the opening 22. The etching step may comprise dry etching, such as reactive-ion etching. FIG. 1B is an outline of an exemplary shape for one of the openings 22 of FIG. 1A. The orientation of the opening 22 is provided to be consistent with the orientation of FIG. 1A. In general, laser drilling and/or etching of the opening 22 from the first surface 12' may provide a large width W₁ and generally rounded opening at the first surface 12' that tapers to a smaller width W₂ of the opening 22 at the second surface 12". A height H of the opening 22 may correspond to a thickness of the substrate 12 of FIG. 1A.

The slope may be defined by an angle α of the sidewall 22' as measured from a perpendicular line to the second surface 12", or interface between the substrate 12 and the active LED structure 14 of FIG. 1A.

Depending on the level of brightness control, the targeted emission pattern, and/or a number and spacing of openings per LED chip in a particular application, the slope of the angle α may be provided in a range from 1 degree (°) to 60°, or 1° to 45°, or 1° to 30°, or 1° to 15°, or 1° to 10°. For applications with lower numbers of openings 22 per LED chip, including a single opening 22, any of the above ranges for the angle α would be suitable. Targeted brightness control and/or a targeted emission pattern may then guide selection of specific subranges of the angle α. For example, larger values of the angle α, such as 30° to 60°, would provide sloped sidewalls that may promote increased lateral emissions, while smaller values, such as below 30°, would provide steeper sloped sidewalls 22' with reduced lateral emissions. Additionally, the values of the angle α may be selected to control an amount of the light-absorbing and/or light-reflecting material of the first contact 24 that resides within each opening 22. In certain embodiments, it may be advantageous to provide an array of the openings 22 per LED chip. For example, the array of openings 22 may be arranged to provide enhanced current spreading across a large area LED chip. In such embodiments, lower values for the angle α may be employed to provide closer spacing between openings 22 of the array. The width W₁ at the first surface 12' may be provided in a range from 40 microns (μm) to 500 μm, or in a range from 40 μm to 100 μm, or in a range from 40 μm to 70 μm, while the width W₂ at the second surface 12" may be smaller than the first width W₁ and in a range from 15 μm to 50 μm, or in a range from 15 μm to 40 μm. Exemplary values for the height H may be a function of the substrate thickness, such as in a range from 350 μm to 500 μm, although other values may be applicable. In other embodiments, the opening 22 may be formed such that the angle α is at or close to 0°. In still further embodiments, the opening may be formed with non-linear sidewalls 22' due to variations in laser and/or etching steps.

Figure 2:
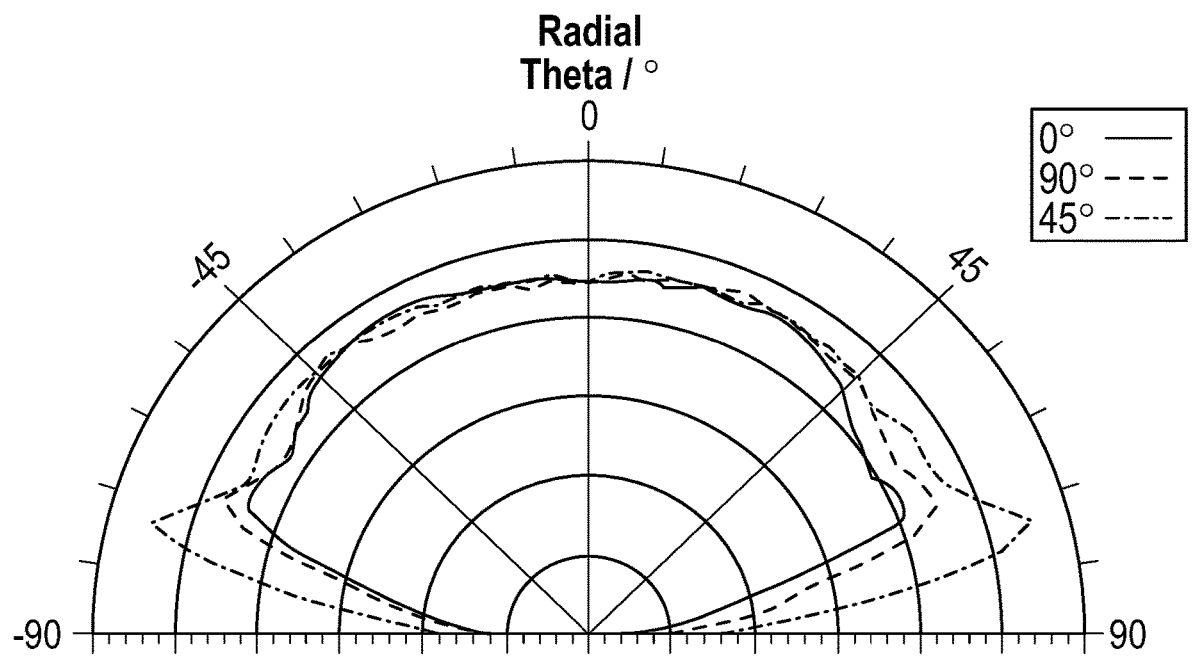
FIG. 2 illustrates a radial light emission pattern across various viewing angles that may be achieved for the LED chip of FIG. 1A.

As described above, light emission patterns for LED chips may be altered by the emission altering features 30 and/or arrangements of the openings 22 and the first contact 24 of FIG. 1A. By way of example, FIG. 2 represents a radial light emission pattern across various viewing angles that may be achieved for the LED chip 10 of FIG. 1A. For reference, an angle of 0° represents a direction that is perpendicular to a top surface or light-emitting surface of the LED chip 10. As illustrated, increased lateral emissions between 45° and 90° may be achieved. The radial pattern provided by FIG. 2 is only one example of the light tailoring capabilities provided by the structure described above for FIG. 1A. In practice, arrangements of one or more of the emission altering features 30, the openings 22, and the first contact 24 of FIG. 1A may provide many different targeted emission patterns.

FIGS. 3A to 8 represent various fabrication steps for providing the LED chip 10 of FIG. 1A. Cross-sections and corresponding top views are provided for various fabrication steps, and for illustrative purposes, the corresponding cross-section and top views provided are not necessarily drawn to scale with respect to one another. While the fabrication steps represented by FIGS. 3A to 8 are provided from the perspective of the single LED chip 10, in practice, multiple ones of the LED chip 10 may be formed together in bulk with the substrate 12 being a common substrate up until singulation. In this manner, each fabrication step may be performed concurrently on an array of LED chips 10 before singulation to arrive at the single LED chip structure as illustrated in FIG. 1A.

Figure 3A:
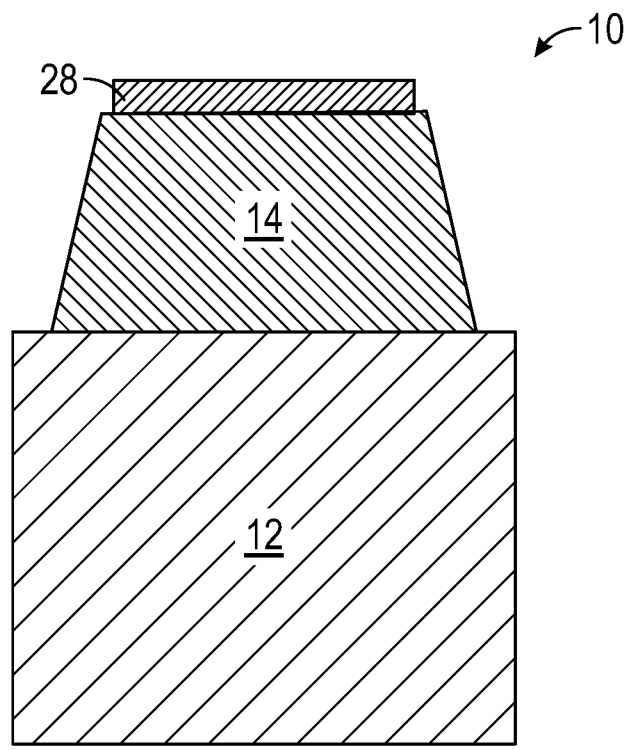
FIG. 3A is a generalized cross-section of the LED chip of FIG. 1A at a fabrication step after the active LED structure and current spreading layer are provided on the substrate.
Figure 3B:
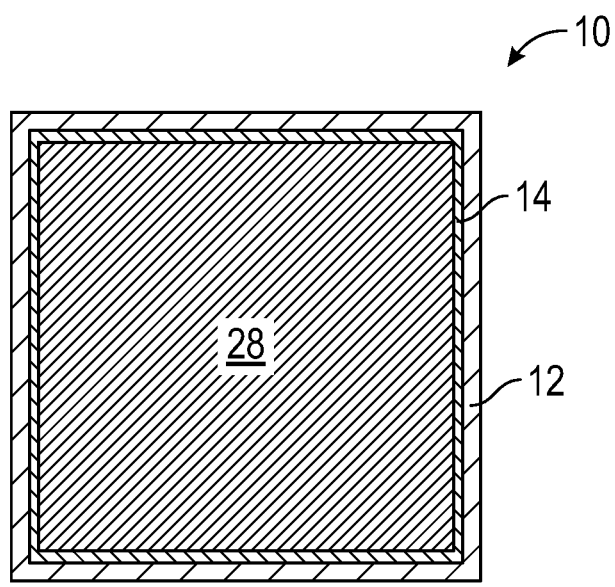
FIG. 3B is a corresponding top view of the LED chip of FIG. 3A.

FIG. 3A is a generalized cross-section of the LED chip 10 of FIG. 1A at a fabrication step after the active LED structure 14 and current spreading layer 28 are provided on the substrate 12. FIG. 3B is a corresponding top view of the LED chip 10 of FIG. 3A. In certain embodiments, the active LED structure 14 may form a mesa with angled sidewalls on the substrate 12. The mesa may be provided by an etching process, such as a gallium phosphide (GaP) etch, that removes portions of the active LED structure 14 all the way to the substrate 12. In the context of an array of the LED chips 10, the etched regions outside of the mesa may form streets through which individual devices are singulated.

FIG. 4A is a generalized cross-section of the LED chip 10 of FIG. 3A at a subsequent fabrication step after the second contact 26 and any emission altering features 30 have been formed. FIG. 4B is a corresponding top view of the LED chip 10 of FIG. 4A. In certain embodiments, the second contact 26 and the emission altering features 30 may comprise a same metal that is patterned on the active LED structure 14 and/or the current spreading layer 28. As best illustrated in FIG. 4B, the emission altering features 30 may be formed with a smaller area than the second contact 26, thereby blocking and/or redirecting certain portions of light from the active LED structure. Relative areas, quantities, and positions of the emission altering features 30 may be adjusted depending on various targets for brightness control and/or emission pattern shaping. While the emission altering features 30 are illustrated as circular, other shapes are possible, including squares, rectangles, and elongated strips. In still further examples, the emission altering features 30 may be formed with different sizes based on relative location along the LED chip 10. For example, a number of emission altering features 30 may be provided with diameters that increase or decrease in a graded manner in directions toward edges of the LED chip 10. In still further examples, the emission altering features 30 may be arranged as one or more concentric rings around the second contact 26. In certain applications, the emission altering features 30 may be omitted. In this manner, FIG. 4C is a corresponding top view of the LED chip 10 of FIG. 4A without the emission altering features 30.

FIG. 5A is a generalized cross-section of the LED chip 10 of FIG. 4A at a subsequent fabrication step after the passivation layer 32 has been formed. FIG. 5B is a corresponding top view of the LED chip 10 of FIG. 5A. FIG. 5C is an alternative corresponding top view of the LED chip 10 of FIG. 5A without the emission altering features 30. The passivation layer 32 is formed to cover top surfaces of the LED chip 10, while leaving open at least a portion of the second contact 26 to provide electrical access. In the manner, an edge 32' of the passivation layer 32 defines an opening therethrough to the second contact 26. In certain embodiments, the passivation layer 32 may overlap portions of the second contact 26 to enhance mechanical integrity of the second contact 26. As illustrated, the passivation layer may be arranged to entirely cover the emission altering features 30, thereby providing electrical isolation. For illustrative purposes to view the underlying elements of the LED chip 10, the edge 32' of the passivation layer 32 is illustrated as a circular line inset from edges of the second contact 26, while the remainder of the passivation layer 32 is illustrated as transparent.

Figure 6A:
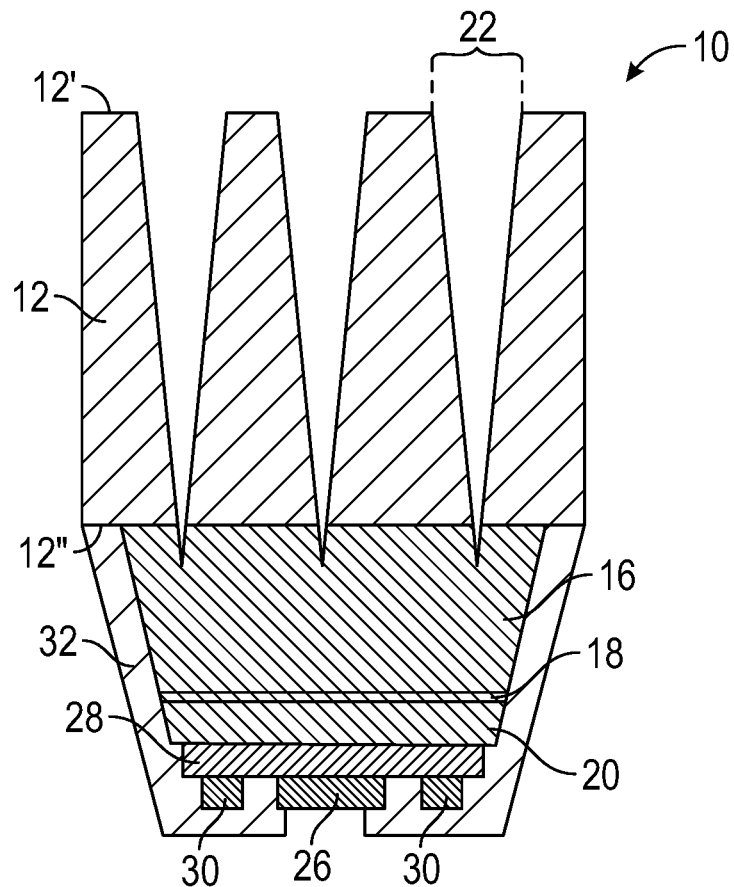
FIG. 6A is a generalized cross-section of the LED chip of FIG. 5A at a subsequent fabrication step after the openings in the substrate have been formed.
Figure 6B:
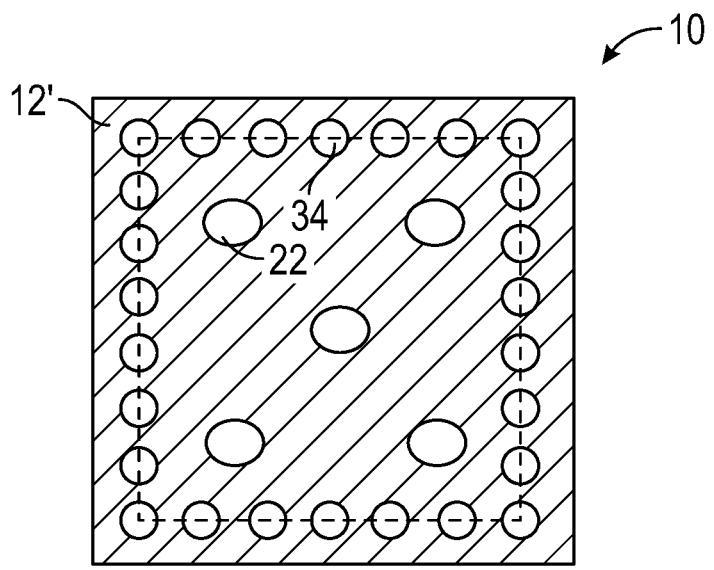
FIG. 6B is a corresponding top view of the LED chip of FIG. 6A from the perspective of the first surface of the substrate.

FIG. 6A is a generalized cross-section of the LED chip 10 of FIG. 5A at a subsequent fabrication step after the openings 22 in the substrate 12 have been formed. Since the openings may be formed from the first surface 12' of the substrate, the orientation of the LED chip 10 is inverted. In certain embodiments, the openings 22 may be formed by laser drilling into the first surface 12' and entirely through the substrate 12 to the n-type layer 16. In other embodiments, laser drilling may be initially administered to partially form the opening 22 followed by an etching step to complete the opening 22. The etching step may comprise dry etching, such as reactive-ion etching. As previously described, the openings 22 may extend into the n-type layer 16. FIG. 6B is a corresponding top view of the LED chip 10 of FIG. 6A from the perspective of the first surface 12' of the substrate 12. The openings 22 may be formed with various patterns based on a size of the LED chip 10 and to promote current spreading. In FIG. 6B, five of the openings 22 are centrally located that correspond to the openings 22 as illustrated in FIG. 6A. In other embodiments, only a single opening 22 may be provided for the LED chip 10. As previously described, the fabrication steps may be formed concurrently for many LED chips 10 that have the substrate 12 in common. In FIG. 6B, a superimposed dashed-line square is provided to indicate a location of dicing lines along the substrate 12 for singulating individual ones of the LED chip 10. When the openings 22 are formed, a number of perimeter openings 34 may be defined in the substrate 12 concurrently with the openings 22. The perimeter openings 34 may be aligned along the dicing lines to promote improved singulation at a later step.

Figure 7:
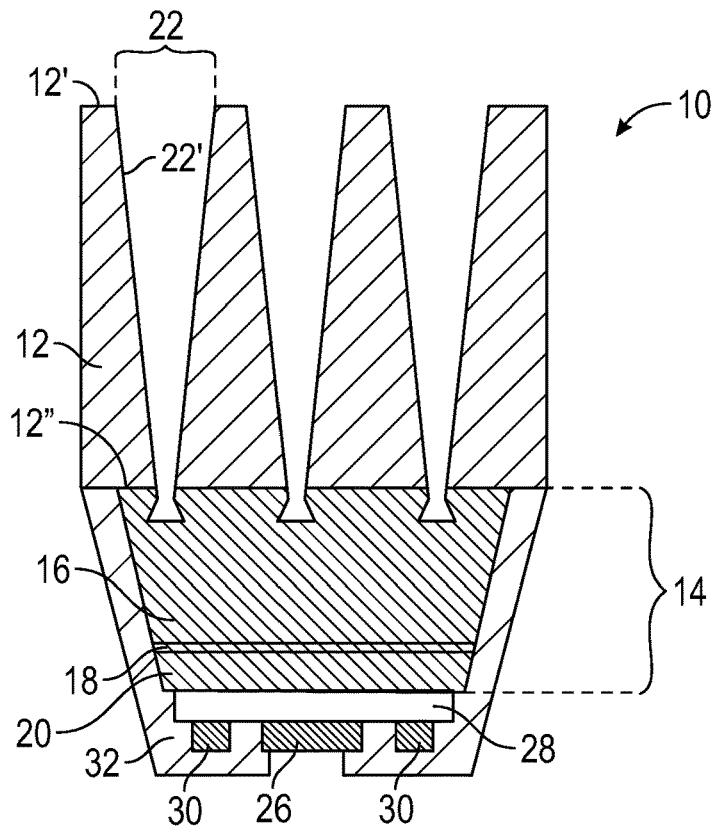
FIG. 7 is a generalized cross-section of the LED chip of FIG. 6A at a subsequent fabrication step after portions of the openings within the n-type layer are expanded to provide increased surface area between the openings and the n-type layer.

FIG. 7 is a generalized cross-section of the LED chip 10 of FIG. 6A at a subsequent fabrication step after portions of the openings 22 within the n-type layer 16 are expanded to provide increased surface area between the openings 22 and the n-type layer 16. In certain embodiments, an etching step, such as another GaP etch, maybe be applied to the openings 22 to clean up any residue left from the laser drilling step and/or dry etching step. The etching step, which may preferentially etch the active LED structure 14, may be configured to increase the size of the openings 22 within the n-type layer 16 as illustrated.

Figure 8:
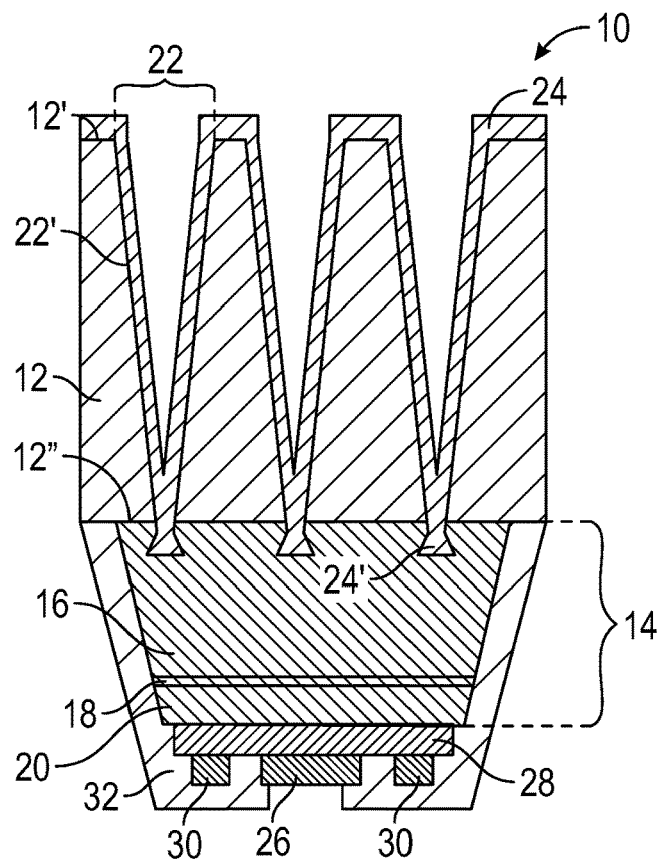
FIG. 8 is a generalized cross-section of the LED chip of FIG. 7A at a subsequent fabrication step after the first contact is provided on the substrate and within the openings.

FIG. 8 is a generalized cross-section of the LED chip 10 of FIG. 7A at a subsequent fabrication step after the first contact 24 is provided on the substrate 12 and within the openings 22. Due to the etching step as described for FIG. 7, the first contact 24 may thus be provided with increased contact area with the n-type layer 16. While the first contact 24 is illustrated as a thin coating that extends along the sidewalls 22', the material of the first contact 24 may also entirely fill the openings 22. After deposition of the first contact 24, the LED chip 10 of FIG. 8 corresponds with the LED chip 10 of FIG. 1A. The orientation shown in FIG. 1A corresponds with a mounting arrangement where the first contact 24 may be mounted to electrical connections on a surface external to the LED chip 10, such as within an LED package.

Figure 9:
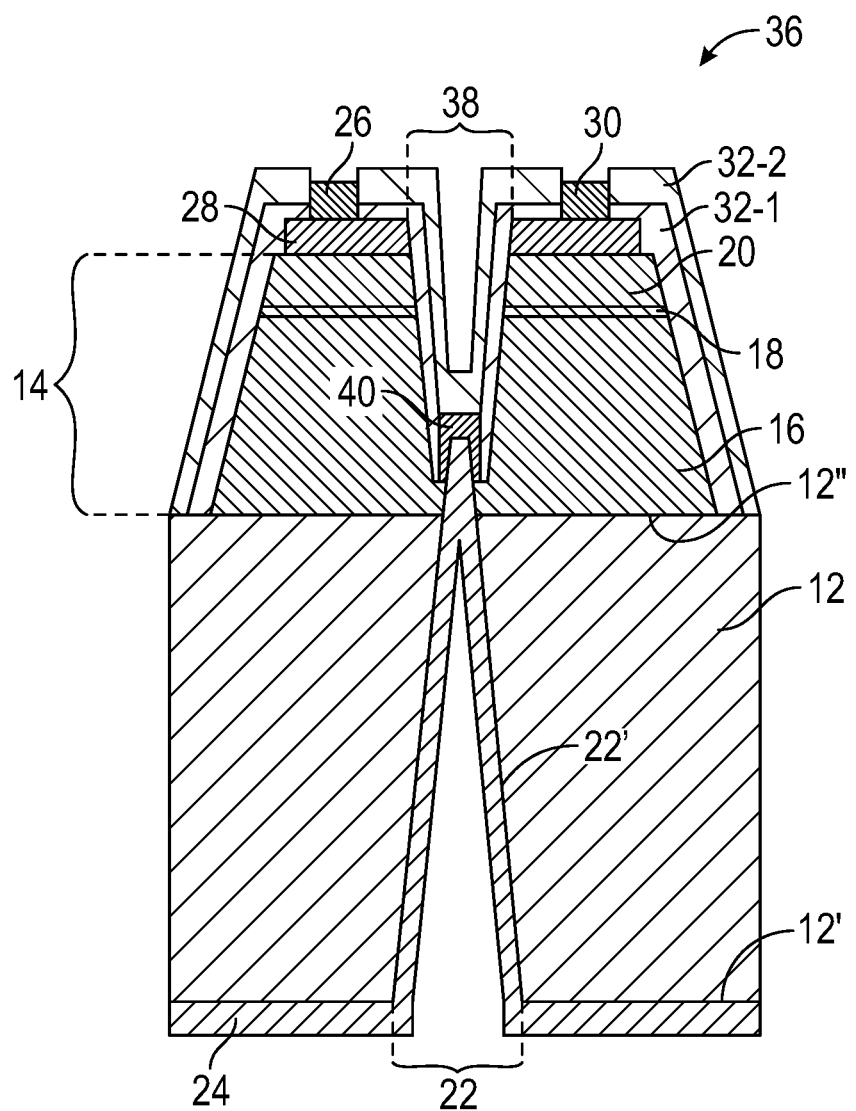
FIG. 9 is a cross-sectional view of an LED chip that is similar to the LED chip of FIG. 1A and further includes an opening formed in the active LED structure where a third contact resides.

FIG. 9 is a cross-sectional view of an LED chip 36 that is similar to the LED chip 10 of FIG. 1A and further includes an opening 38 formed in the active LED structure 14 where a third contact 40 resides. The third contact 40 is provided on and electrically coupled to the n-type layer 16 through the opening 38. As illustrated, the opening 22 of the substrate 12 is vertically registered or otherwise aligned with the opening 38 of the active LED structure 14. The first contact 24 may extend through a portion of the n-type layer 16 that is between the third contact 40 and the substrate 12. In this regard, the first contact 24 may directly contact and be electrically coupled to the third contact 40 to provide enhanced electrically coupling with the n-type layer 16. As such, the first contact 24 and the third contact 40 may collectively form the cathode contact for the LED chip 36. By providing the third contact 40 within the opening 38 of the active LED structure 14, the third contact 40 may form an extension of the first contact 24 with increased surface area contact of the n-type layer 16. In particular, dimensions and layouts of the third contact 40 are not limited by the manner in which the openings 22 of the substrate 12 are formed. Rather, the opening 38 of the active LED structure 14 may provide access to larger portions of the n-type layer 16. As will be described in greater detail below, such flexibility provides the ability to form the opening 38 with extensions or trenches that laterally extend away from the opening 22 of the substrate 12. In this manner, the first contact 24 may extend through the opening 22 of the substrate 12 to make an electrically connection with a portion of the third contact 40, and the remainder of the third contact 40 may be configured to cover more lateral surface area of the n-type layer 16. The LED chip 36 may include first and second passivation layers 32-1, 32-2 that provide topside electrical isolation for the third contact 40 while allowing topside access to at least the second contact 26.

FIGS. 10A to 16C represent various fabrication steps for providing the LED chip 36 of FIG. 9. Cross-sections and corresponding top views are provided for various fabrication steps, and for illustrative purposes, the corresponding cross-section and top views provided are not necessarily drawn to scale with respect to one another. While the fabrication steps represented by FIGS. 10A to 16C are provided from the perspective of the single LED chip 36, in practice, multiple ones of the LED chip 36 may be formed together in bulk with the substrate 12 being a common substrate up until singulation. In this manner, each fabrication step may be performed concurrently on multiple LED chips 36 before singulation to arrive at the single LED chip structure as illustrated in FIG. 9.

FIG. 10A is a generalized cross-section of the LED chip 36 of FIG. 9 at a fabrication step after the active LED structure 14 and current spreading layer 28 are provided on the substrate 12 and the opening 38 is formed through a portion of the active LED structure 14. The opening 38 is arranged to extend through the p-type layer 20 and the active layer 18 while partially extending into the n-type layer 16. The opening 38 may be formed concurrently with the mesa etch as described for FIG. 3A. In other embodiments, the opening 38 may be formed with a separate fabrication step. FIG. 10B is a corresponding top view of the LED chip 36 of FIG. 10A with one arrangement of the opening 38, and FIG. 10C is a corresponding top view of the LED chip 36 of FIG. 10A with another arrangement of the opening 38. In both FIGS. 10B and 10C, a portion of the n-type layer 16 is visible through the opening 38. In FIG. 10B, the opening 38 is centrally located in a position that may be aligned or registered with the opening 22 of FIG. 9. The opening 38 may be formed with many different shapes, including the circular shape as illustrated. In FIG. 10C, the opening 38 forms a smaller circular shape that is offset from a center position and the opening 38 further includes lateral extensions that laterally traverse across the n-type layer 16. In such an arrangement, a portion of the opening 38, such as the smaller circular shape in the corner, may be registered or aligned with the opening 22 of FIG. 9 and the remainder of the opening 38 may provide increased access to other portions of the n-type layer 16.

Figure 11:
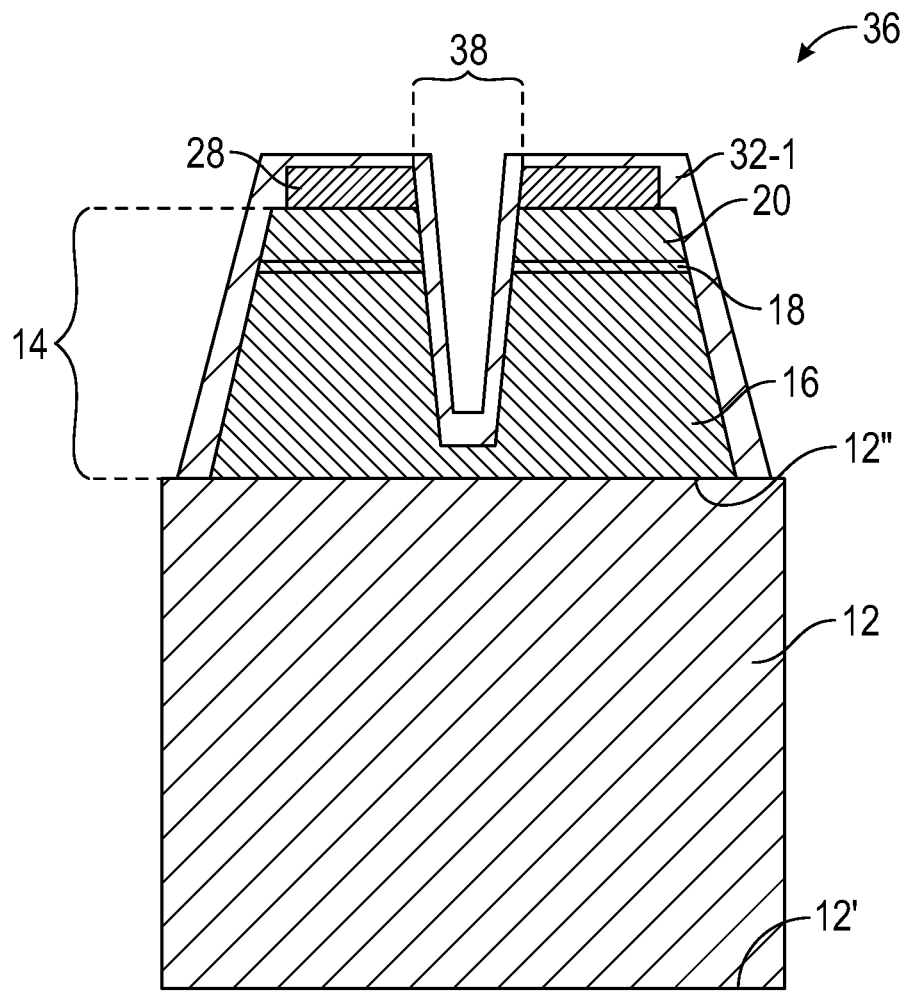
FIG. 11 is a generalized cross-section of the LED chip of FIG. 10A at subsequent fabrication step after the first passivation layer has been formed.

FIG. 11 is a generalized cross-section of the LED chip 36 of FIG. 10A at a subsequent fabrication step after the first passivation layer 32-1 has been formed. As illustrated, the first passivation layer 32-1 may be formed in a conformal manner along mesa sidewalls of the active LED structure 14, over top surfaces of the current spreading layer 28, and to cover sidewalls and a floor of the opening 38. In this manner, electrical shorting within the active LED structure 14 may be avoided in both the mesa sidewalls and within the opening 38.

Figure 12A:
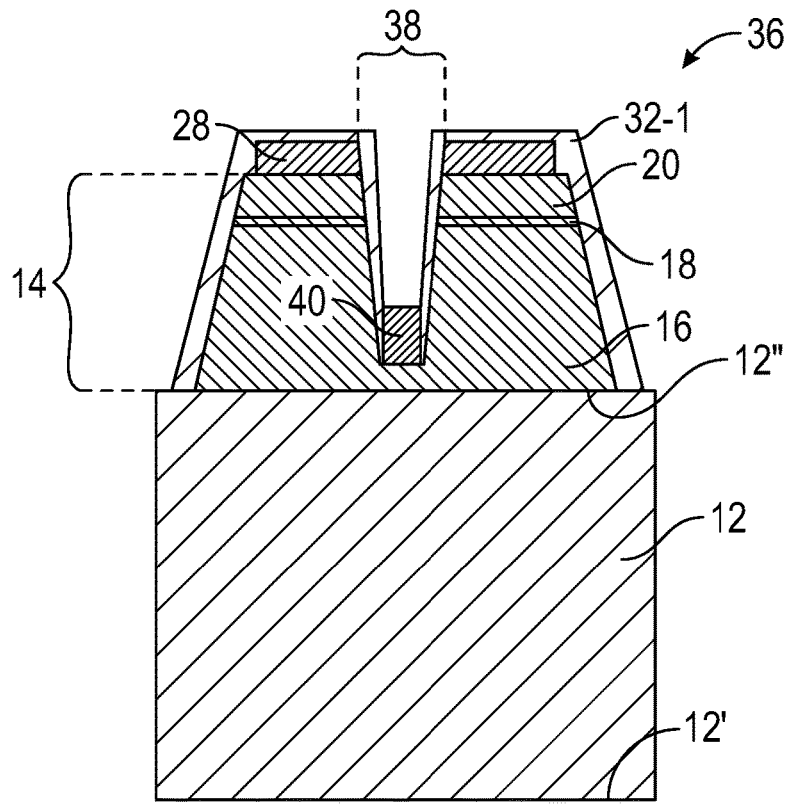
FIG. 12A is a generalized cross-section of the LED chip of FIG. 11 at fabrication step after the third contact is formed within the opening.
Figures 12B, 12C:
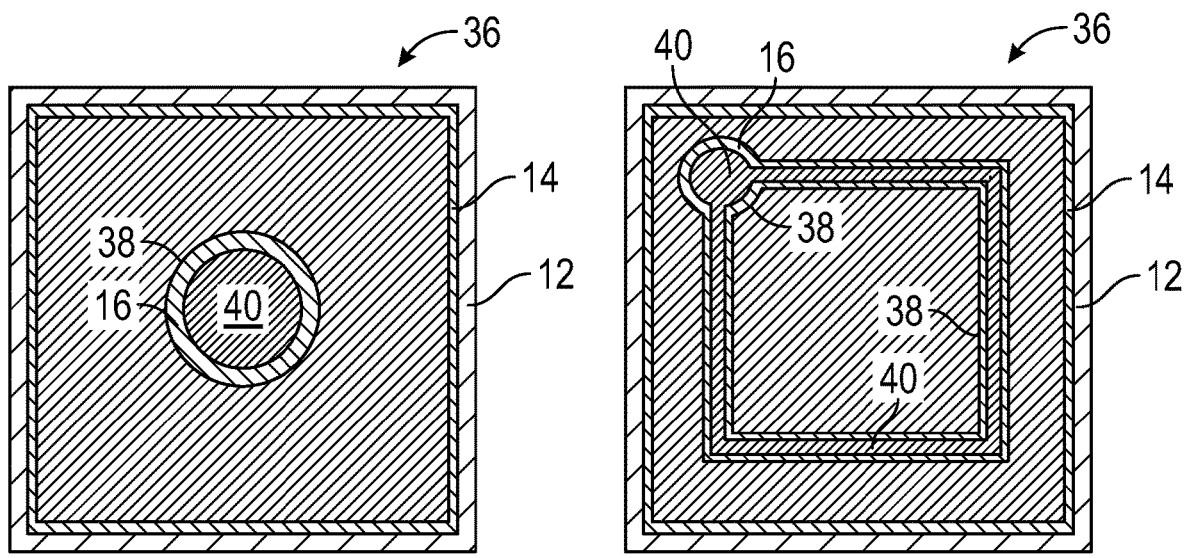
FIG. 12B is a corresponding top view of the LED chip of FIG. 12A that is similar to the top view provided by FIG. 10B.
FIG. 12C is a corresponding top view of the LED chip of FIG. 12A with another arrangement of the opening that is similar to the top view provided by FIG. 10C.

FIG. 12A is a generalized cross-section of the LED chip 36 of FIG. 11 at a fabrication step after the third contact 40 is formed within the opening 38. FIG. 12B is a corresponding top view of the LED chip 36 of FIG. 12A that is similar to the top view provided by FIG. 10B. FIG. 12C is a corresponding top view of the LED chip 36 of FIG. 12A with another arrangement of the opening 38 that is similar to the top view provided by FIG. 10C. As illustrated in FIG. 12A, a portion of the first passivation layer 32-1 is removed within the opening 38 and the third contact 40 is formed to contact the n-type layer 16 therethrough. The third contact 40 may include a single metal deposition step or multiple deposition steps with one or more different sub-layers. For example, the third contact 40 may comprise one or more of gold (Au), copper (Cu), nickel (Ni), In, Al, Ag, tin (Sn), Pt, or combinations thereof deposited on the exposed portions of the n-type layer 16. The third contact 40 may further comprise an additional deposition of a barrier layer, with suitable materials including but not limited to titanium-platinum (Ti/Pt) followed by Au or titanium-nickel (Ti/Ni) followed by titanium-gold (Ti/Au) bulk material. In FIG. 12B, the third contact 40 is deposited with a circular shape that is inset from the circular shape of the opening 38. In FIG. 12C, the third contact 40 is further arranged with contact extensions or contact fingers within the lateral extensions of the opening 38 that follow the opening 38 across the LED chip 36 for enhanced current spreading. In this manner, the embodiment of FIG. 12C may be advantageous for larger chip areas.

Figure 13:
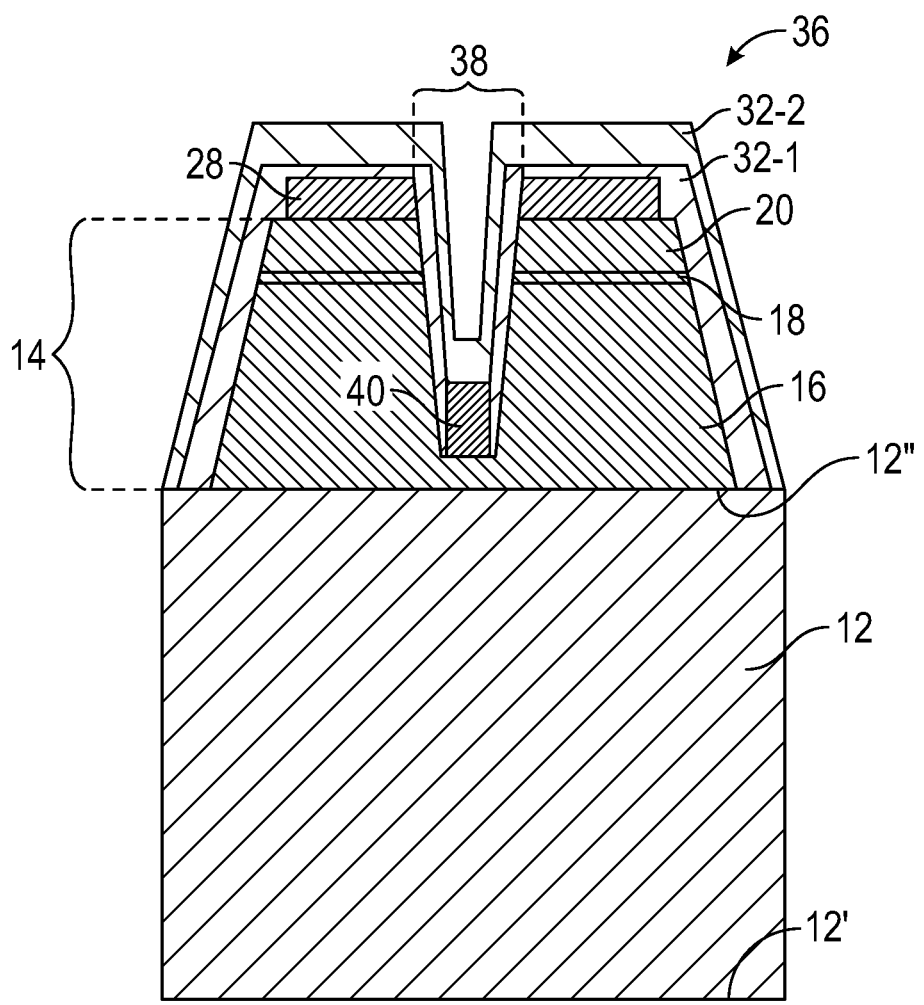
FIG. 13 is a generalized cross-section of the LED chip of FIG. 12A at a subsequent fabrication step after the second passivation layer has been formed.

FIG. 13 is a generalized cross-section of the LED chip 36 of FIG. 12A at a subsequent fabrication step after the second passivation layer 32-2 has been formed. As illustrated, the second passivation layer 32-2 may be formed in a conformal manner on the first passivation layer 32-1 and to cover the third contact 40. In this regard, the third contact 40 is electrically coupled to the n-type layer 16 within the active LED structure 14 while also being electrically insulated from top surfaces of the LED chip 36. In particular, the third contact 40 may be arranged between the n-type layer 16 and portions of the first and second passivation layers 32-1, 32-2.

Figure 14A:
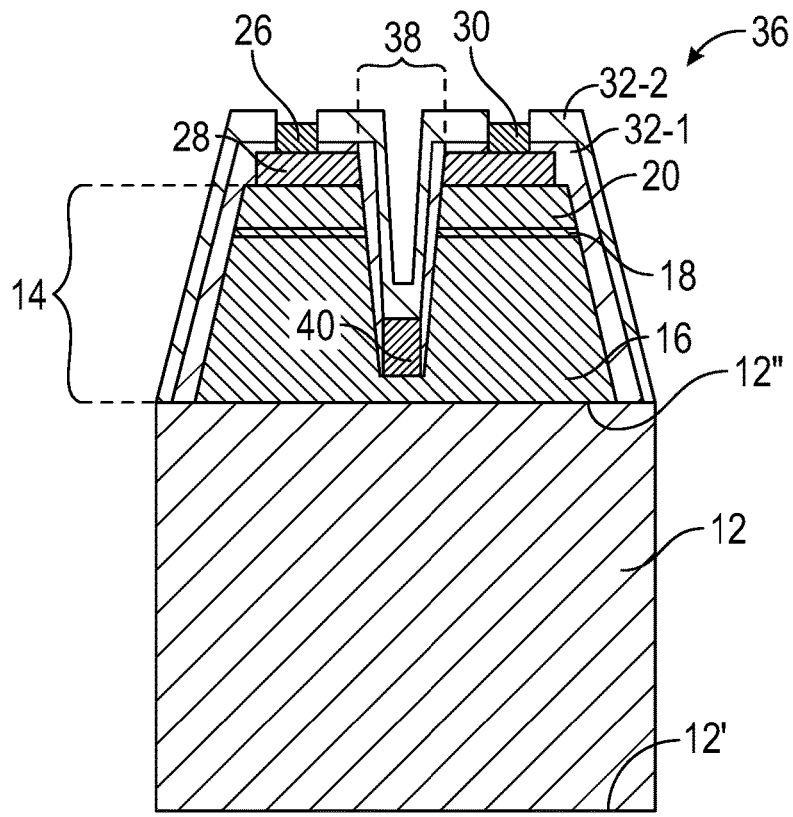
FIG. 14A is a generalized cross-section of the LED chip of FIG. 13 at a fabrication step after the second contact and any emission altering features are formed.
Figure 14B:
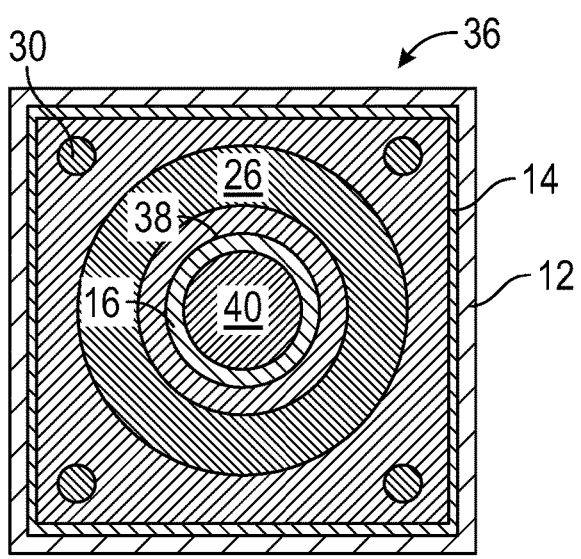
FIG. 14B is a corresponding top view of the LED chip of FIG. 14A that is similar to the top view provided by FIG. 12B.
Figure 14C:
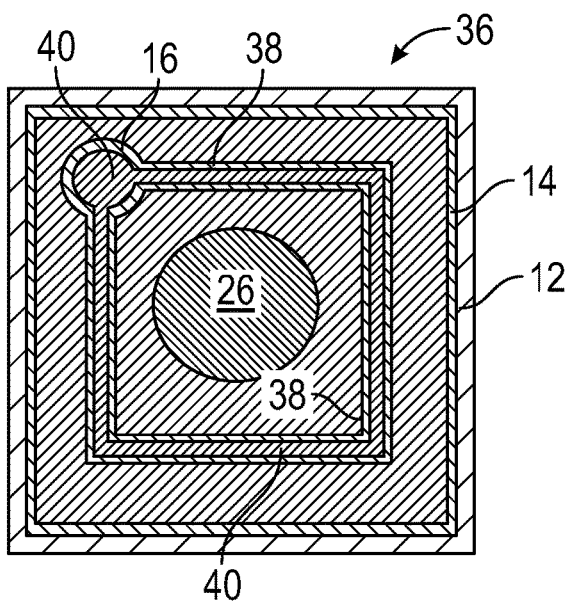
FIG. 14C is a corresponding top view of the LED chip of FIG. 14A with another arrangement of the opening that is similar to the top view provided by FIG. 12C.

FIG. 14A is a generalized cross-section of the LED chip 36 of FIG. 13 at a fabrication step after the second contact 26 and any emission altering features 30 are formed. FIG. 14B is a corresponding top view of the LED chip 36 of FIG. 14A that is similar to the top view provided by FIG. 12B. FIG. 14C is a corresponding top view of the LED chip 36 of FIG. 14A with another arrangement of the opening 38 that is similar to the top view provided by FIG. 12C. As best illustrated in FIG. 14A, portions of the first and second passivation layers 32-1, 32-2 may be removed such that the second contact 26 may formed on and electrically coupled with the p-type layer 20 by way of the current spreading layer 28. When present, the emission altering features 30 may also be formed in a similar manner as the second contact 26. In the arrangement of FIG. 14B, the second contact 26 may be formed in a circular arrangement around the opening 38 and corresponding third contact 40. As illustrated, various ones of the emission altering features 30 may optionally be provided as previously described for brightness control and/or emission pattern shaping. In the arrangement of FIG. 14C, the second contact 26 may be centrally located with respect to the opening 38 and corresponding third contact 40.

Figure 15:
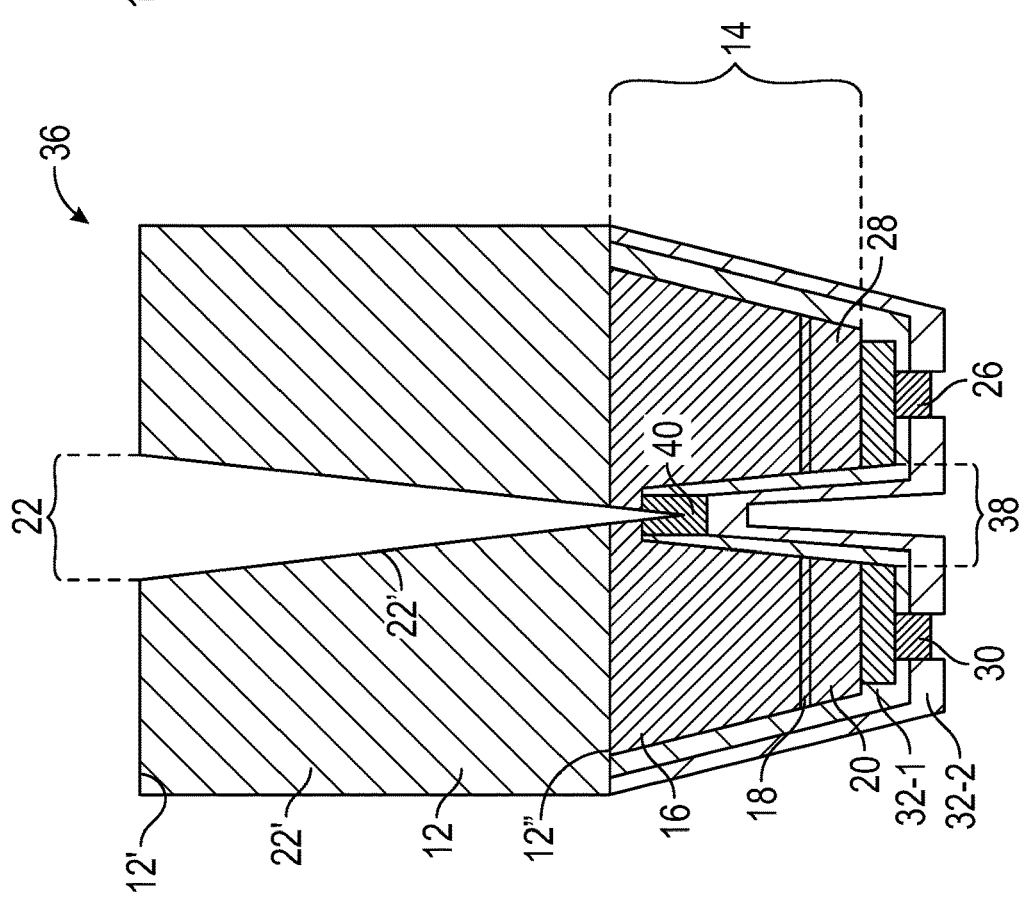
FIG. 15 is a generalized cross-section of the LED chip of FIG. 14A at subsequent fabrication step after the opening in the substrate has been formed.

FIG. 15 is a generalized cross-section of the LED chip 36 of FIG. 14A at a subsequent fabrication step after the opening 22 in the substrate 12 has been formed. Since the opening 22 may be formed from the first surface 12' of the substrate, the orientation of the LED chip 36 in FIG. 15 is inverted. In certain embodiments, the opening 22 may be formed by laser drilling into the first surface 12' and entirely through the substrate 12 and into the n-type layer 16. As illustrated, the opening 22 may be formed to also extend into portions of the third contact 40. During the portion of the fabrication step when the opening 22 is being formed in the third contact 40, residue of the material of the third contact 40 may be redeposited along sidewalls 22' of the opening 22. In this manner, such residue of the third contact 40 may advantageously provide seed portions of electrically conductive material within the opening 22 for the subsequently formed first contact 24 of FIG. 16A. In particular, when the opening 22 is formed with smaller dimensions, such as steep angles and/or smaller widths, the residue of the third contact 40 may help cover portions of the opening 22 near the third contact 40 that are difficult to cover during deposition of the first contact 24 of FIG. 16A.

Figure 16A:
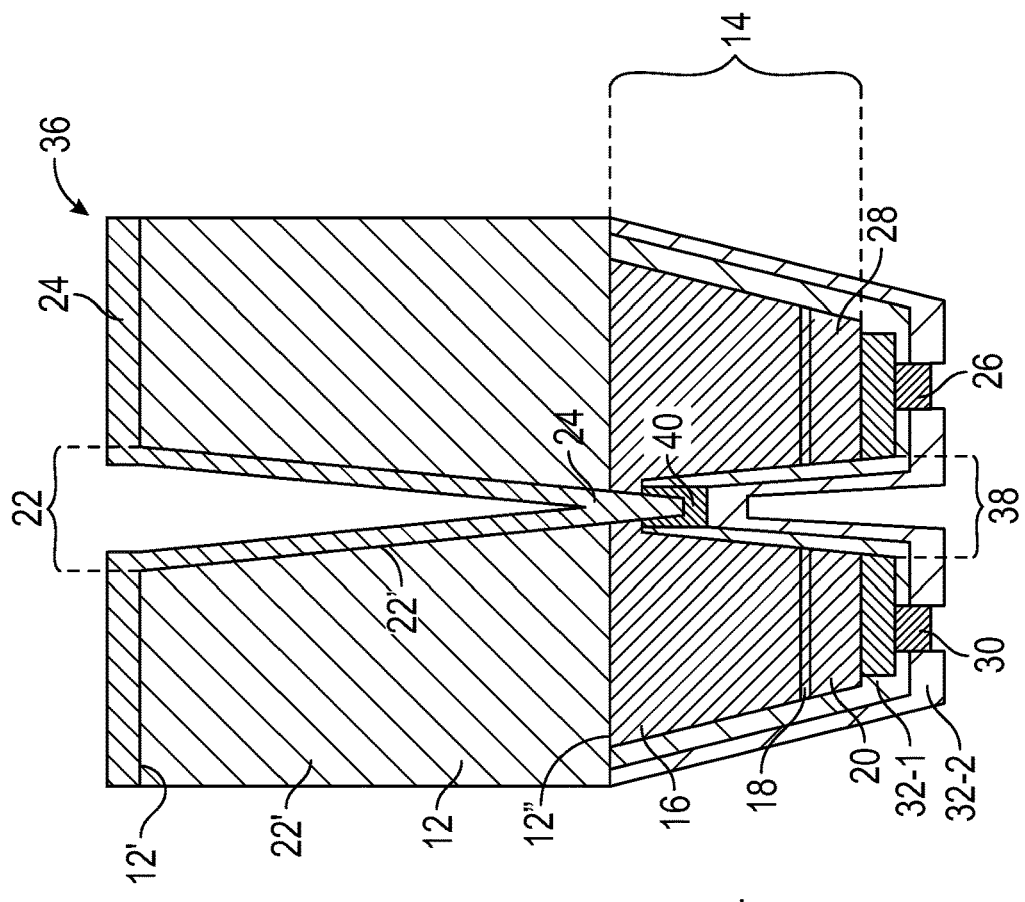
FIG. 16A is a generalized cross-section of the LED chip of FIG. 15 at a fabrication step after the first contact is formed.
Figure 16B:
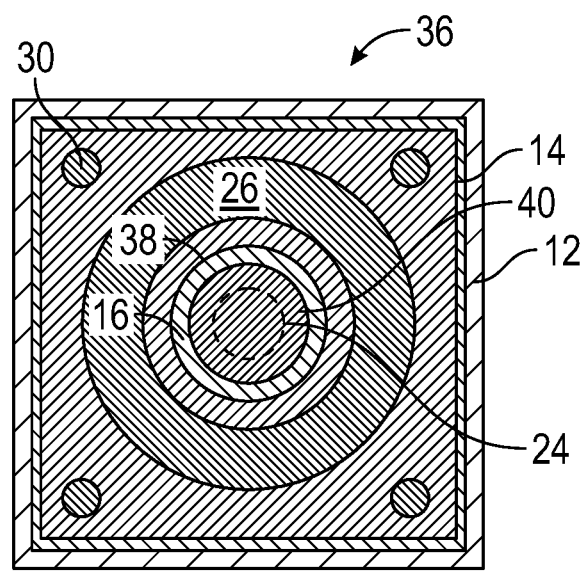
FIG. 16B is a corresponding top view of the LED chip of FIG. 16A that is similar to the top view provided by FIG. 14B.
Figure 16C:
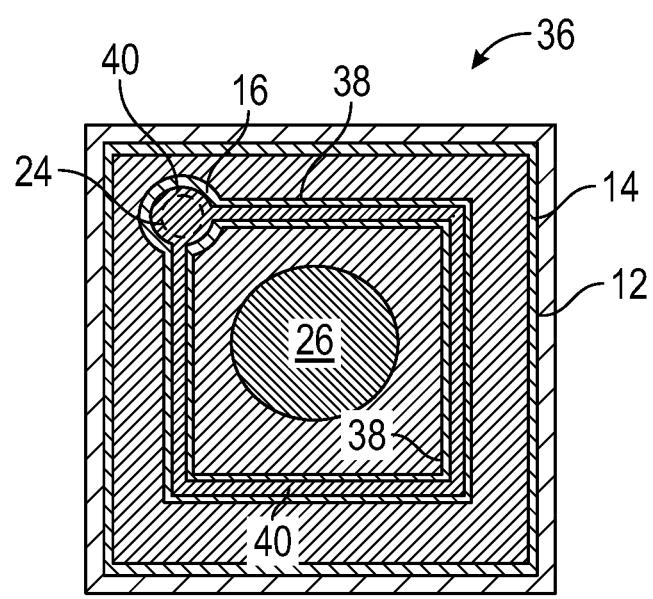
FIG. 16C is a corresponding top view of the LED chip of FIG. 16A that is similar to the top view provided by FIG. 14C.

FIG. 16A is a generalized cross-section of the LED chip 36 of FIG. 15 at a fabrication step after the first contact 24 is formed. FIG. 16B is a corresponding top view of the LED chip 36 of FIG. 16A that is similar to the top view provided by FIG. 14B. FIG. 16C is a corresponding top view of the LED chip 36 of FIG. 16A that is similar to the top view provided by FIG. 14C. As best illustrated in FIG. 16A, a portion of the first contact 24 is formed in contact with the third contact 40 at an end of the opening 22. In certain embodiments, a portion of the first contact 24 may extend into the third contact 40 since the opening 22 may be formed to extend into the third contact 40 as illustrated in FIG. 15. In this regard, the third contact 40 may be electrically accessed through the substrate 12 by way of the first contact 24. In FIGS. 16B and 16C, relative locations of the portion of the first contact 24 that connects with the third contact 40 are illustrated with superimposed dashed line circles. In FIG. 16B, the first contact 24 connects with a central area of the third contact 40. In FIG. 16C, the first contact 24 connects with a portion of the third contact 40 and the remainder of the third contact 40 provides lateral current spreading as described above.

Figure 17A:
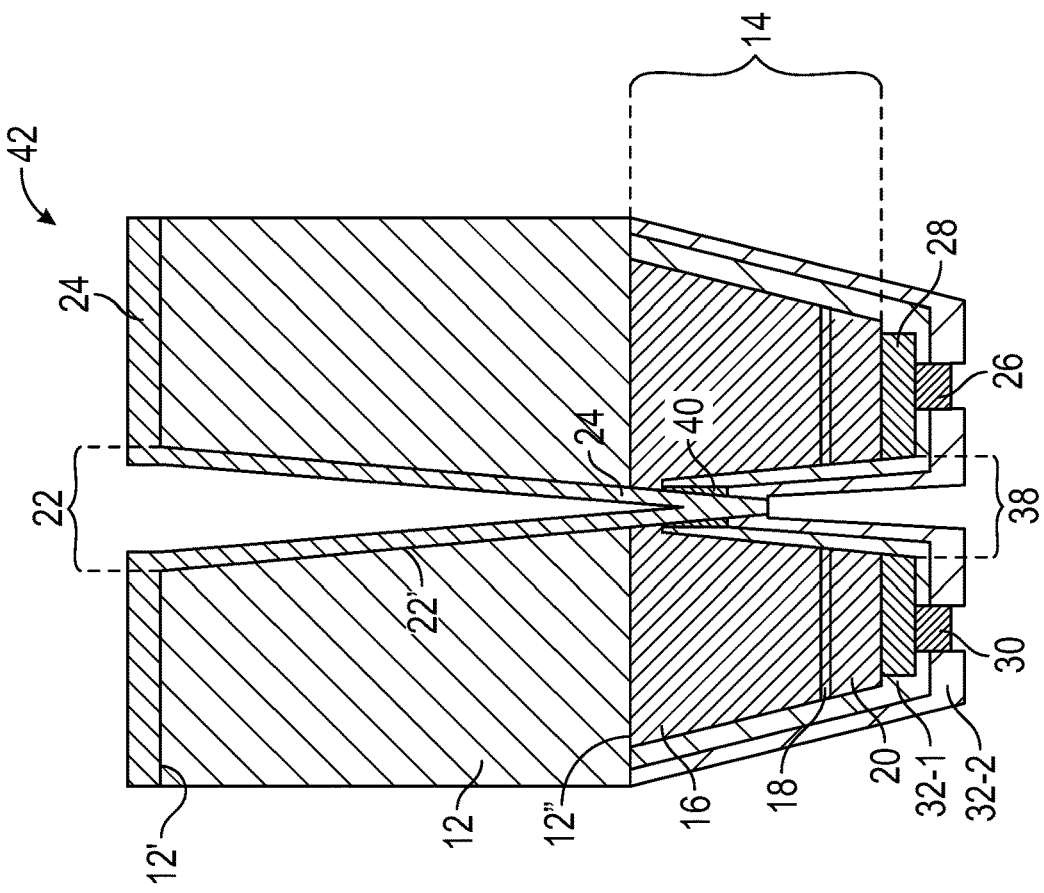
FIG. 17A is a generalized cross-section of an LED chip that is similar to the LED chip of FIG. 15, except the opening of the substrate is formed to extend through the third contact and the first and second passivation layers.
Figure 17B:
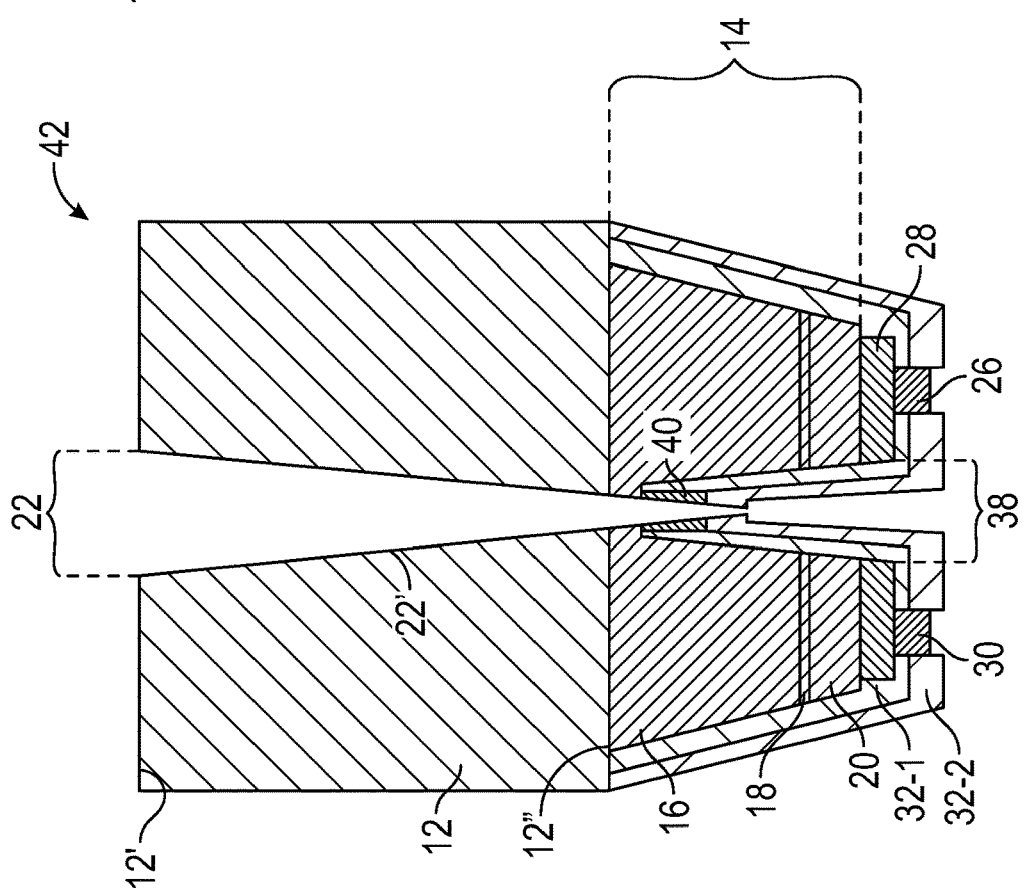
FIG. 17B is a generalized cross-section of the LED chip of FIG. 17A after the first contact is formed.

FIGS. 17A and 17B are generalized cross-sections of an LED chip 42 that is similar to the LED chip 36 of FIG. 16A, and the LED chip 42 includes an arrangement where the opening 22 from the first face 12' is formed to extend to the opening 38. FIG. 17A is similar to the LED chip 36 of FIG. 15, except the opening 22 is formed to extend through the third contact 40 and the first and second passivation layers 32-1, 32-2. In this regard, the opening 22 and the opening 38 form a combined opening that extends through an entire thickness of the LED chip 42. In FIG. 17B, the first contact 24 is formed on the first face 12' and within the opening 22 to electrically connect with the third contact 40. In certain embodiments, the first contact 24 may extend entirely through the third contact 40 such that a portion of the first contact 24 extends farther away from the second face 12" than the third contact 40. As such, a portion of the first contact 24 may extend into a portion of the opening 38. By forming the opening 22 as illustrated in FIG. 17A, increased process tolerance may be provided by ensuring the opening 22 is repeatably formed deep enough to provide sufficient electrical connections between the third contact 40 and the first contact 24. The increased amount of the third contact 40 may also increase surface area within the LED chip 42 for improved thermal spreading.

Figure 18A:
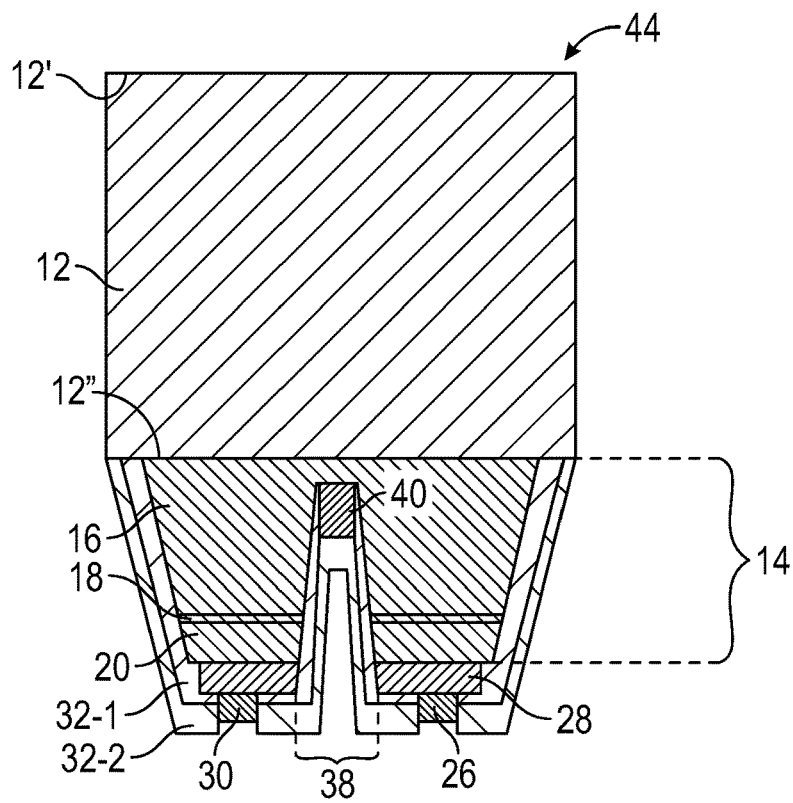
FIG. 18A is a generalized cross-section of an LED chip that is similar to the LED chip of FIG. 14A.
Figure 18B:
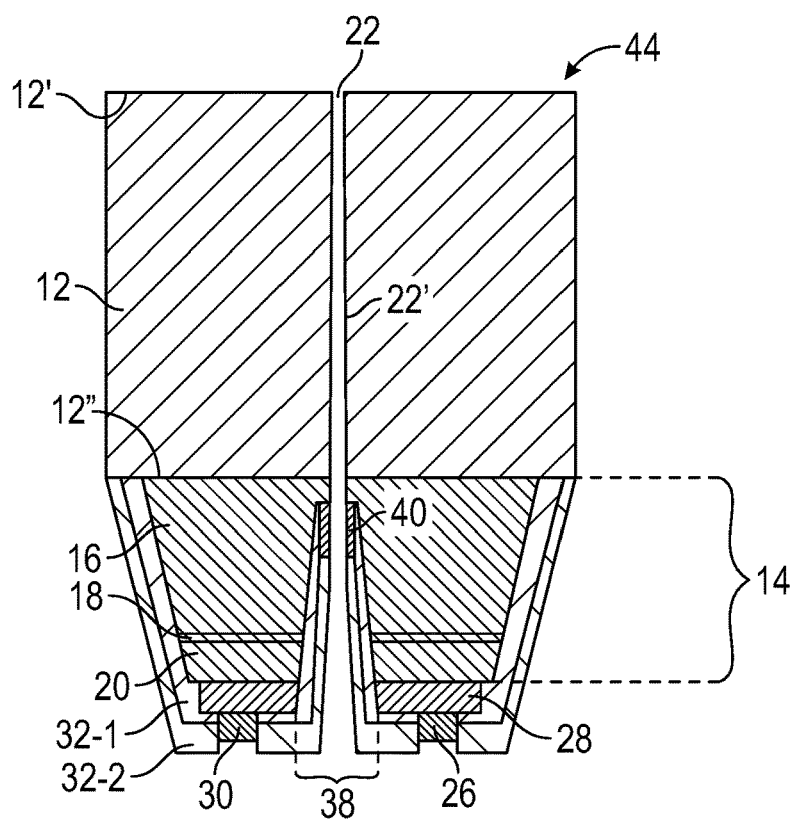
FIG. 18B is a generalized cross-section of the LED chip of FIG. 18A after the opening of the substrate is formed from an opposite side of the LED chip as the substrate.
Figure 18C:
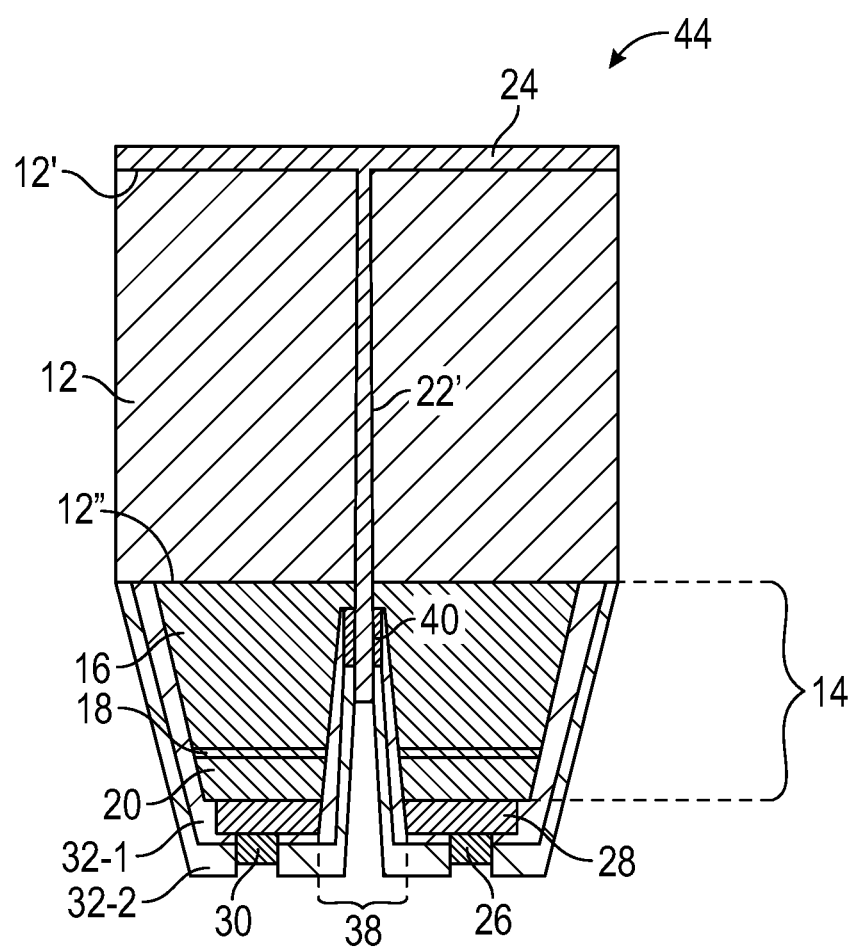
FIG. 18C is a generalized cross-section of the LED chip of FIG. 18A after the first contact is formed.

FIGS. 18A to 18C are generalized cross-sections of an LED chip 44 that is similar to the LED chip 42 of FIGS. 17A-17B, and the LED chip 44 includes an arrangement where the opening 22 is formed through the opening 38 and the second face 12" to reach the first face 12' of the substrate 12. In FIG. 18A, the LED chip 44 is similar to the LED chip 36 at the fabrication step illustrated in FIG. 14A. In FIG. 18B, the opening 22 is formed from the same side of the LED chip 44 as the opening 38. In this manner, the opening 22 may be formed through the opening 38, the first and second passivation layers 32-1, 32-2, the third contact 40, the n-type layer 16, and the substrate 12. As such, the opening 22 and the opening 38 form a combined opening that extends through an entire thickness of the LED chip 44. In FIG. 18C, the first contact 24 is formed on the first face 12' and within the opening 22 of FIG. 18B to electrically connect with the third contact 40. In a similar manner as described for the LED chip 42 of FIG. 17B, the first contact 24 may extend entirely through the third contact 40 to ensure sufficient electrical connections between the third contact 40 and the first contact 24 in high volume manufacturing.

As described above, substrates according to the present disclosure may include insulating substrates, such as sapphire, AlN, or insulating SiC, among others. In other embodiments, substrates may embody multiple layer structures where one or more insulating layers are formed on conducting support elements. The one or more insulating layers may form a base or buffer structure on which active LED structures may subsequently be formed. The insulating layers may include electrically insulating epitaxial layers, such as one or more layers of AlN, various high Al % alloys such as AlGaN, undoped epitaxially layers, and/or combinations thereof. The combined structure of the insulating layers and conductive support element may accordingly be referred to as a substrate in an interchangeable manner with any of the previously described embodiments.

Figure 19:
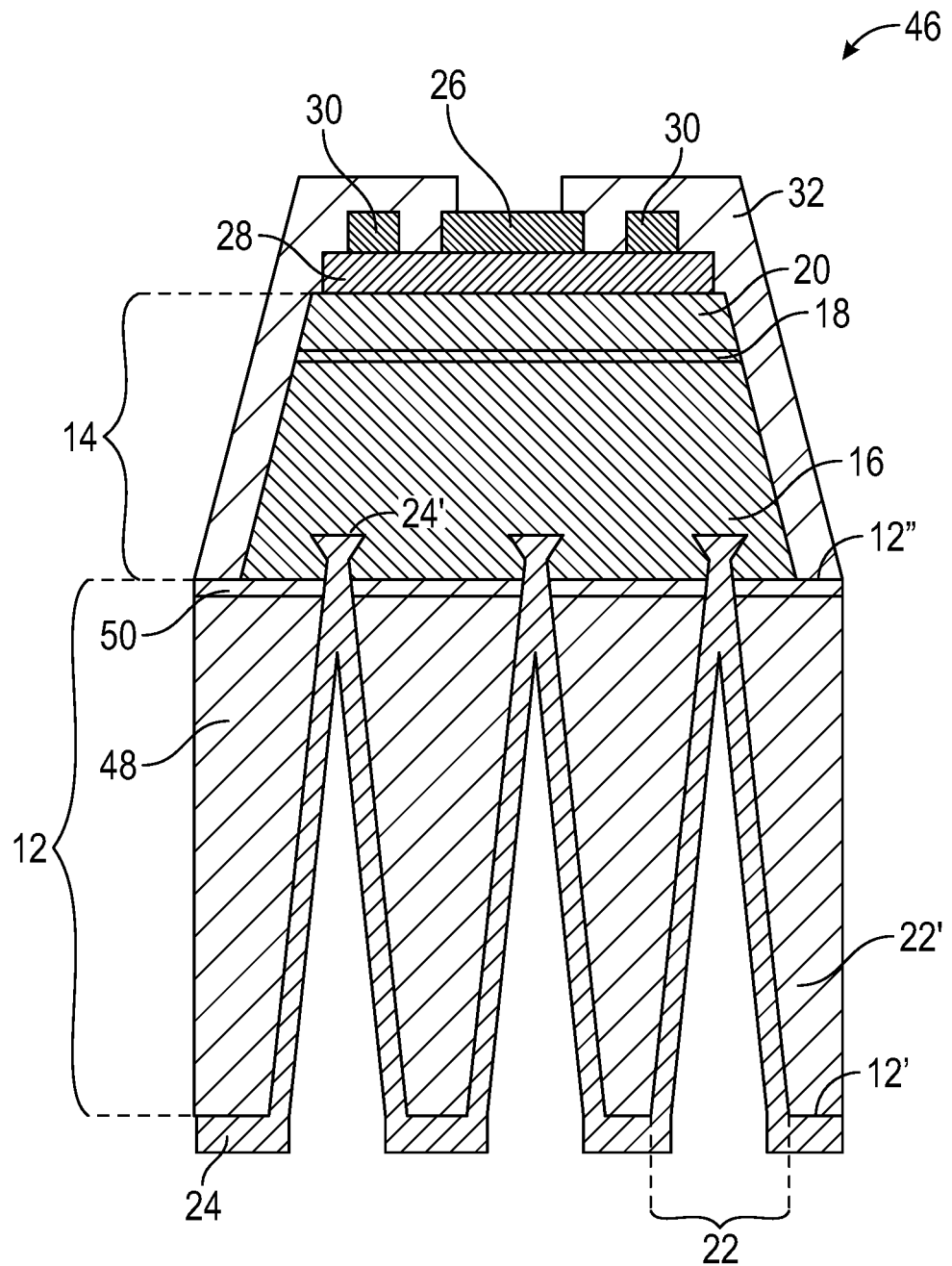
FIG. 19 is a generalized cross-section of an LED chip that is similar to the LED chip of FIG. 1A for embodiments where the substrate includes a conductive support element and one or more insulating layers.

FIG. 19 is a generalized cross-section of an LED chip 46 that is similar to the LED chip 10 of FIG. 1A for embodiments where the substrate 12 includes a conductive support element 48 and one or more insulating layers 50 formed thereon. In certain embodiments, the mesa formed by the active LED structure 14 may extend to the insulating layers 50 of the substrate 12. In this regard, the insulating layers 50 may laterally extend past peripheral edges of the active LED structure 12. As illustrated, the first contact 24 is arranged to extend entirely through the insulating layers 50 such that at least the portions 24' may electrically connect with the n-type layer 16.

Figure 20:
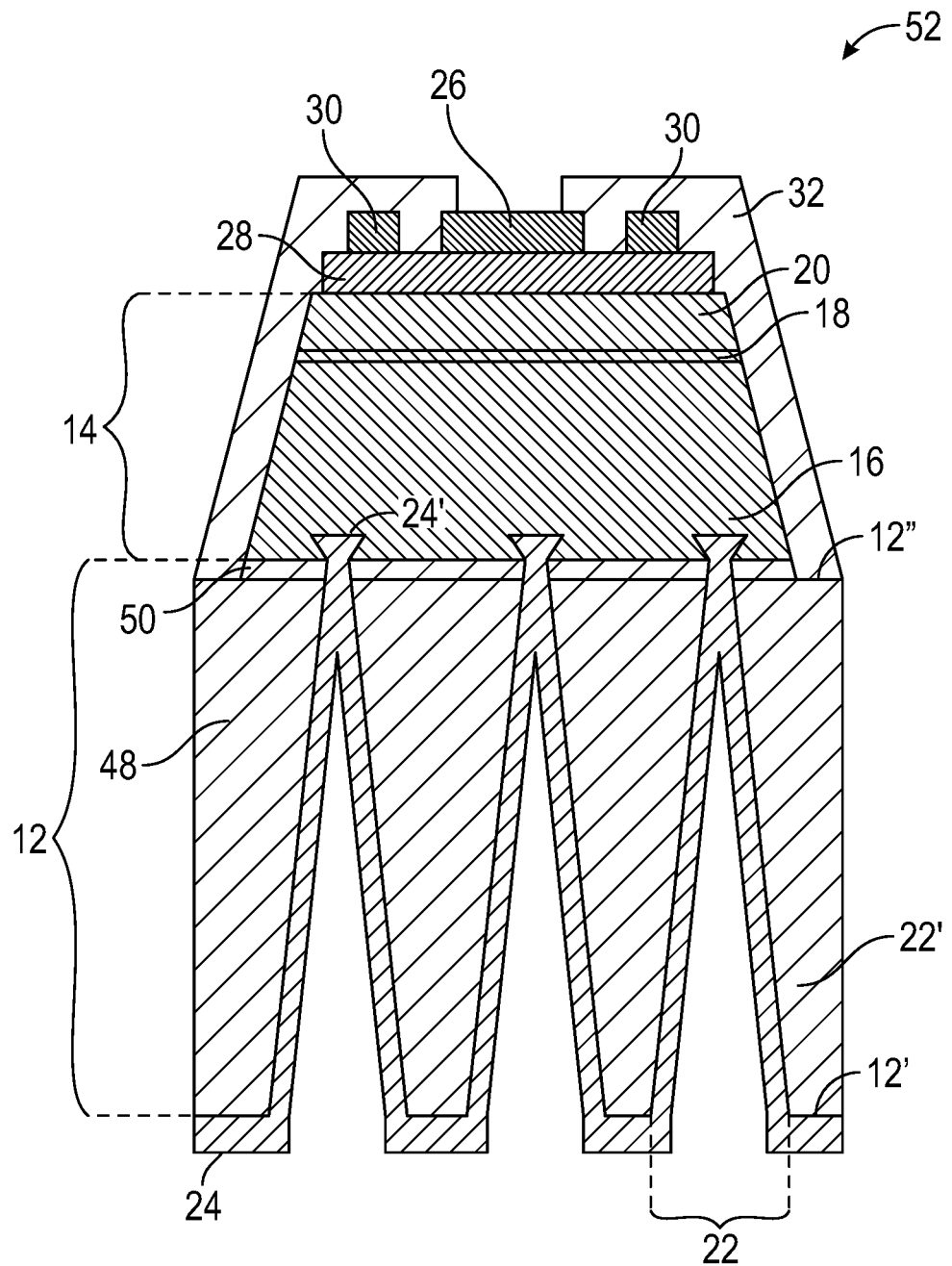
FIG. 20 is a generalized cross-section of an LED chip that is similar to the LED chip of FIG. 19 for embodiments where portions of the insulating layers may also be etched when the mesa for the active LED structure is formed.

FIG. 20 is a generalized cross-section of an LED chip 52 that is similar to the LED chip 46 of FIG. 19 for embodiments where portions of the insulating layers 50 may also be etched when the mesa for the active LED structure 14 is formed. In this manner, portions of the conductive support element 48 may laterally extend past peripheral edges of both the active LED structure 14 and the insulating layers 50.

Figure 21:
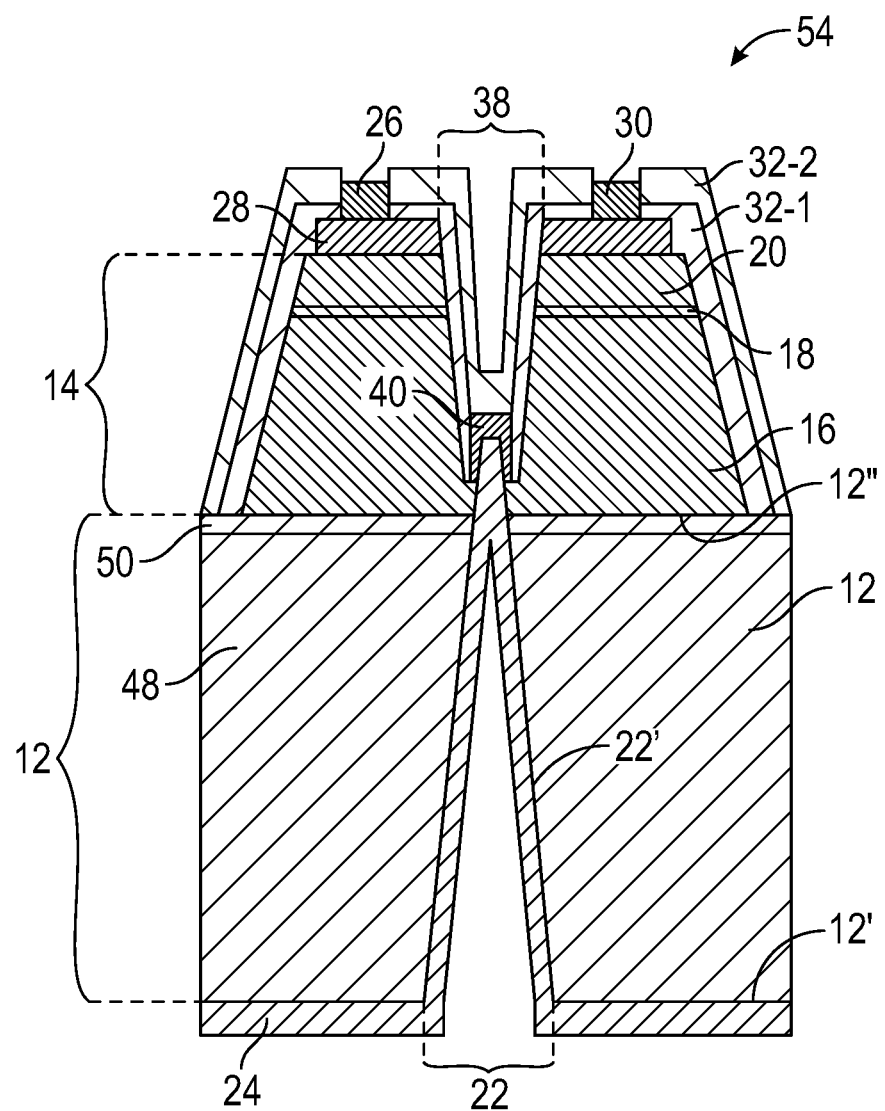
FIG. 21 is a generalized cross-section of an LED chip that is similar to the LED chip of FIG. 9 for embodiments where the substrate includes a conductive support element and one or more insulating layers.

FIG. 21 is a generalized cross-section of an LED chip 54 that is similar to the LED chip 36 of FIG. 9 for embodiments where the substrate 12 includes the conductive support element 48 and the insulating layers 50. The arrangement of the substrate 12 in FIG. 21 is similar to the substrate 12 as described for FIG. 19. In this regard, the mesa formed by the active LED structure 14 may extend to the insulating layers 50 of the substrate 12 and the insulating layers 50 may laterally extend past peripheral edges of the active LED structure 12.

Figure 22:
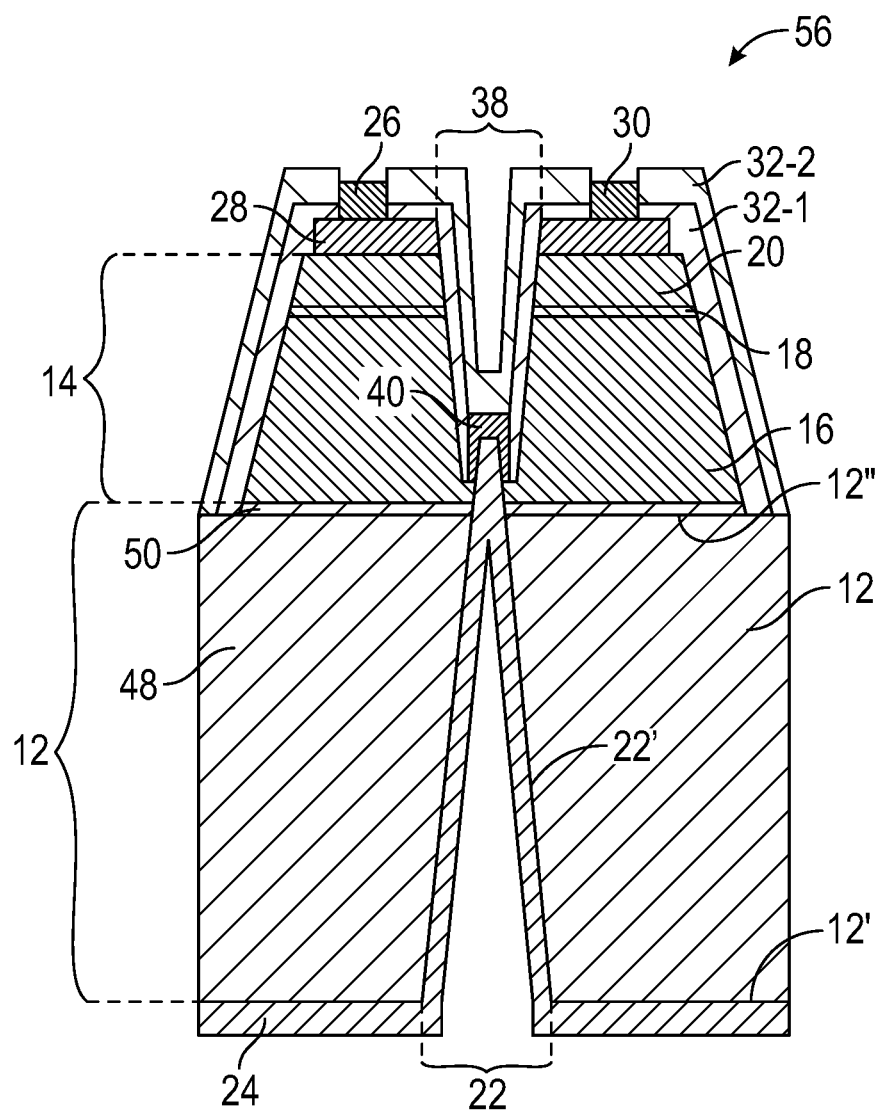
FIG. 22 is a generalized cross-section of an LED chip that is similar to the LED chip of FIG. 21 for embodiments where portions of the insulating layers may also be etched when the mesa for the active LED structure is formed.

FIG. 22 is a generalized cross-section of an LED chip 56 that is similar to the LED chip 54 of FIG. 21 for embodiments where portions of the insulating layers 50 are also etched when the mesa for the active LED structure 14 is formed. In this regard, portions of the conductive support element 48 may laterally extend past peripheral edges of both the active LED structure 14 and the insulating layers 50.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:
1. A light-emitting diode (LED) chip comprising:
a substrate that is electrically insulating, the substrate forming an opening that extends through an entire thickness of the substrate;
an active LED structure on the substrate, the active LED structure comprising a n-type layer, an active layer, and a p-type layer;
a first contact on a portion of the substrate that is outside the opening and on a sidewall of the opening, the first contact extending from the sidewall and into the n-type layer, the first contact being in electrical contact with the n-type layer, and a width of the portion of the first contact within the n-type layer is wider than a width of the opening at an interface between the substrate and the active LED structure; and
a second contact on and in electrical contact with the p-type layer such that the active LED structure and at least a portion of the substrate are arranged between the first contact and the second contact.
2. The LED chip of claim 1, wherein:
the substrate comprises a first surface and a second surface that is opposite the first surface, and the second surface forms the interface with the active LED structure; and
the opening comprises a first width at the first surface and a second width at the second surface, wherein the first width is larger than the second width.
3. The LED chip of claim 2, wherein the opening comprises a sloped sidewall between the first surface and the second surface.
4. The LED chip of claim 3, wherein the sloped sidewall forms an angle as measured from a perpendicular line to the second surface, wherein the angle is in a range from 1 degree to 60 degrees.
5. The LED chip of claim 4, wherein the angle is in a range from 1 degree to 30 degrees.

6. The LED chip of claim 2, wherein the first width is in a range from 40 microns (μm) to 100 μm.

7. The LED chip of claim 1, further comprising an emission altering feature on the p-type layer and laterally spaced from the second contact, wherein the emission altering feature is configured to absorb or reflect a portion of light generated by the active LED structure.

8. The LED chip of claim 7, wherein the emission altering feature comprises a same material as the second contact.

9. The LED chip of claim 7, wherein the emission altering feature comprises a same thickness as the second contact.

10. The LED chip of claim 1, wherein the substrate comprises sapphire.

11. The LED chip of claim 1, wherein the substrate comprises an electrically insulating layer on a conductive support element.

12. A light-emitting diode (LED) chip comprising:
- a substrate that is electrically insulating, the substrate comprising a first surface, a second surface, and a first opening that extends from the first surface to the second surface;
- an active LED structure on the second surface of the substrate, the active LED structure comprising a n-type layer, an active layer, a p-type layer, and a second opening that extends through the p-type layer, the active layer, and a portion of the n-type layer, wherein the first opening is vertically registered with the second opening;
- a first contact within the first opening;
- a second contact on and in electrical contact with the p-type layer; and
- a third contact within the second opening, wherein the first contact and the third contact are electrically coupled with the n-type layer.

13. The LED chip of claim 12, wherein the first contact is arranged to extend through a portion of the n-type layer to contact the third contact.

14. The LED chip of claim 13, wherein the first contact is further arranged to extend into at least a portion of the third contact.

15. The LED chip of claim 12, wherein the third contact is in contact with a greater surface area of the n-type layer than the first contact.

16. The LED chip of claim 12, wherein the second opening forms an extension that laterally traverses across the n-type layer.

17. The LED chip of claim 16, wherein the third contact comprises a contact extension that is arranged within the extension of the second opening.

18. The LED chip of claim 12, further comprising one or more passivation layers that cover the third contact within the second opening.

19. The LED chip of claim 12, wherein the first opening comprises a first width at the first surface and a second width at the second surface, wherein the first width is larger than the second width.

20. The LED chip of claim 12, wherein the first opening comprises a sloped sidewall between the first surface and the second surface.

21. The LED chip of claim 20, wherein the sloped sidewall forms an angle as measured from a perpendicular line to the second surface, wherein the angle is in a range from 1 degree to 60 degrees.

22. The LED chip of claim 12, wherein the substrate comprises sapphire.

23. The LED chip of claim 12, wherein the substrate comprises an electrically insulating layer on a conductive support element.

24. The LED chip of claim 12, wherein the first contact is arranged to extend entirely through the n-type layer and the third contact and into a portion of the second opening.

* * * * *